US 8,896,185 B2
(12) United States Patent
Takahashi

(10) Patent No.: US 8,896,185 B2
(45) Date of Patent: Nov. 25, 2014

(54) PIEZOELECTRIC DEVICE

(75) Inventor: Takehiro Takahashi, Sayama (JP)

(73) Assignee: Nihon Dempa Kogyo Co., Ltd., Tokyo (JP)

(*) Notice: Subject to any disclaimer, the term of this patent is extended or adjusted under 35 U.S.C. 154(b) by 489 days.

(21) Appl. No.: 13/232,118

(22) Filed: Sep. 14, 2011

(65) Prior Publication Data

US 2012/0068578 A1 Mar. 22, 2012

(30) Foreign Application Priority Data

Sep. 16, 2010 (JP) ................................ 2010-207861

(51) Int. Cl.
*H01L 41/053* (2006.01)
*H03H 3/02* (2006.01)
*H03H 9/05* (2006.01)

(52) U.S. Cl.
CPC ............... *H03H 9/0595* (2013.01); *H03H 3/02* (2013.01)
USPC .......................................... 310/344; 310/348

(58) Field of Classification Search
USPC .......................................... 310/340, 344, 348
See application file for complete search history.

(56) References Cited

U.S. PATENT DOCUMENTS

| 3,137,836 | A | * | 6/1964 | Glover ........................... 367/165 |
| 4,641,054 | A | * | 2/1987 | Takahata et al. .............. 310/324 |
| 5,430,345 | A | * | 7/1995 | Takahashi ..................... 310/348 |
| 5,699,027 | A | * | 12/1997 | Tsuji et al. ..................... 333/193 |
| 6,472,797 | B1 | * | 10/2002 | Kishimoto ..................... 310/324 |
| 6,794,799 | B2 | * | 9/2004 | Takeshima et al. ........... 310/348 |
| 7,518,291 | B2 | | 4/2009 | Tanaya |
| 2003/0067248 | A1 | | 4/2003 | Dalla Piazza et al. |
| 2004/0201326 | A1 | * | 10/2004 | Yokoi et al. ................... 310/348 |

FOREIGN PATENT DOCUMENTS

| JP | S61-138275 | 8/1986 |
| JP | S61-256656 | 11/1986 |
| JP | H07-042154 | 7/1995 |
| JP | 08-125050 | 5/1996 |
| JP | 2000-150687 | 5/2000 |
| JP | 2002-170895 | 6/2002 |
| JP | 2003-163560 | 6/2003 |
| JP | 2004-104766 | 4/2004 |
| JP | 2004-222053 | 8/2004 |
| JP | 2005-109886 | 4/2005 |
| JP | 2007-073713 | 3/2007 |
| JP | 2007-274071 | 10/2007 |
| JP | 2009-278612 | 11/2009 |

OTHER PUBLICATIONS

Search Report for Corresponding Taiwanese Patent Application No. 100132934.

* cited by examiner

*Primary Examiner* — Thomas Dougherty
(74) *Attorney, Agent, or Firm* — Alix, Yale & Ristas, LLP

(57) ABSTRACT

A piezoelectric device (100) comprises: a piezoelectric vibrating piece (101); a frame body (105) separated from piezoelectric vibrating piece by through-hole (108); a piezoelectric frame (10) having a supporting portion (104), a first surface (Me) and a second surface (Mi); a package lid (11) having a first connecting surface (M1) a package base (12), including a mounting surface (M4) for forming a pair of external electrodes (125) and a top surface having a second connecting surface (M2); a first sealing material (LG1) formed between the first connecting surface and the first surface; and a second sealing material (LG2) formed between the second connecting surface and the second surface. The first sealing material or the second sealing material extends to a side surface (M3) of the through-hole.

17 Claims, 16 Drawing Sheets

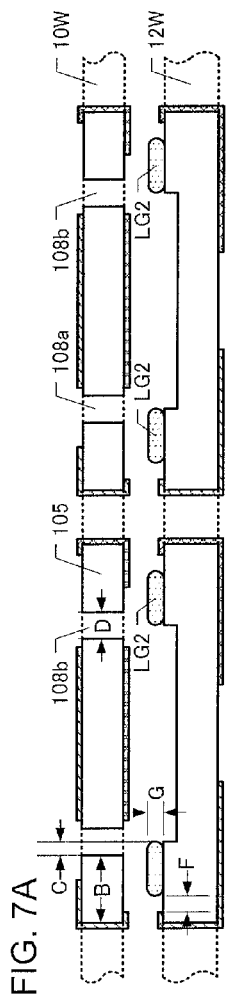
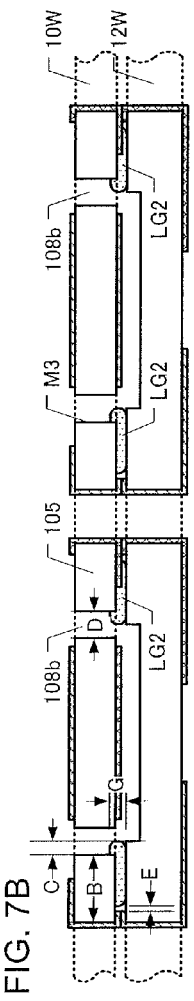
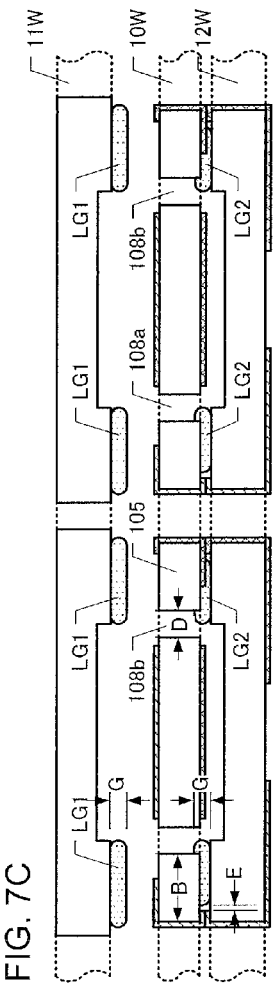
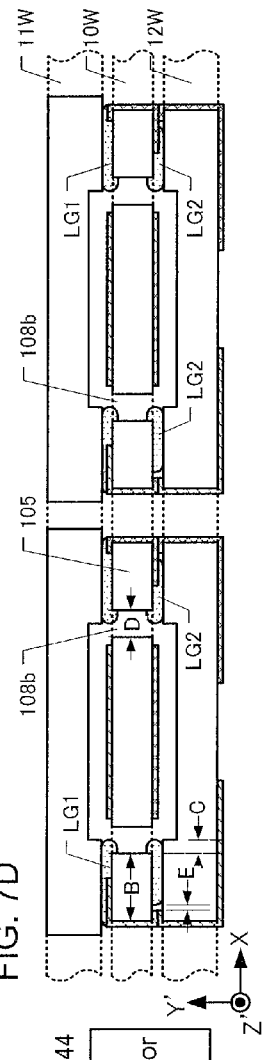

PIEZOELECTRIC DEVICE

CROSS-REFERENCE TO RELATED APPLICATION

This application claims priority to and the benefit of Japan Patent Application No. 2010-207861, filed on Sep. 16, 2010, in the Japan Patent Office, the disclosure of which is incorporated herein by reference in its entirety.

FIELD

The present disclosure relates to a piezoelectric device in which a piezoelectric vibrating piece is sandwiched between a package lid and a package base.

DESCRIPTION OF THE RELATED ART

For the purpose of the manufacturing cost reduction, a piezoelectric device is disclosed, in which a piezoelectric vibrating piece having a frame is sandwiched between a package base and a package lid. The Japan Unexamined Patent Document 2004-222053 discloses a piezoelectric device, in which a frame body is disposed surrounding a piezoelectric vibrating piece. Between a package base and a frame body, a low-melting-point glass or colloidal silica is thickly formed as a sealing material, and between a lid and a frame body, a low-melting-point glass or colloidal silica is thickly formed as a sealing material.

However, as the piezoelectric device miniaturizes, the width of the frame body becomes narrower. As the width of the frame body becomes narrower, the width of sealing material becomes narrower, which brings to the leakage of gas or water vapor from outside to inside a cavity, or leakage of gas from inside a cavity to the outside of a piezoelectric device. Thus the narrower width of sealing material leads to degradation of a frame body. If a piezoelectric vibrating piece is miniaturized instead of narrowing the width of the frame body, the CI value (crystal impedance value) of the piezoelectric vibrating piece tends to increase. Therefore, it is not preferred to miniaturize the piezoelectric vibrating piece instead of narrowing the width of the frame body.

It is therefore the purpose of the present disclosure to provide a piezoelectric device, in which the width of the frame body is maintained to be narrow, the leakage of gases and vapors from outside of the piezoelectric device to the cavity or vice versa remains small and the device is shock resistant.

SUMMARY

A first aspect is directed to a piezoelectric device. In its first aspect, a piezoelectric device comprises: a piezoelectric frame, including a piezoelectric vibrating piece, a frame body surrounding the piezoelectric vibrating piece and separated therefrom by at least one through hole, and a supporting portion for supporting the piezoelectric vibrating piece to the frame body, each piezoelectric frame having a first surface and a second surface; a package lid having a first connecting surface, in which at least a part of the first connecting surface opposes to the first surface of the frame body; a package base, including a mounting surface for forming a pair of external electrodes and a top surface formed opposite the mounting surface, said bottom surface including at least a part of a second connecting surface opposed to the second surface; a first sealing material formed between the first connecting surface and the first surface of the frame body; and a second sealing material formed between the second connecting surface and the second surface of the frame body. At least one of the first sealing material or the second sealing material extends onto the side surface of the opening through-hole of the frame body.

A second aspect is directed to a piezoelectric device. In its second aspect, the first sealing material and the second sealing material are connected at the side surface.

A third aspect is directed to a piezoelectric device. In its third aspect, the package lid, the piezoelectric frame and the package base have a rectangular shape with four sides as viewed from the mounting surface; and a relationship is described as B≤A×0.1; Wherein a length of the one side is A and a width of the frame body is B.

A fourth aspect is directed to a piezoelectric device. In its fourth aspect, the first sealing material is formed on the first connecting surface with a width of 5 μm or wider width than the width B of the frame body; the second sealing material is formed on the second connecting surface with a width of 5 μm or wider width than the width B of the frame body; and the width of the opening through-hole is 10 μm or wider.

A fifth aspect is directed to a piezoelectric device. In its fifth aspect, a step portion is formed on the first surface or the second surface, so as to reduce the thickness of the side surfaces of the opening through-holes.

A sixth aspect is directed to a piezoelectric device. In its sixth aspect, a plurality of grooves is continuously formed on the opening through-hole of the piezoelectric body, as viewed from the mounting surface.

A seventh aspect is directed to a piezoelectric device. In its seventh aspect, a piezoelectric device comprises: a piezoelectric vibrating piece that vibrates when electrical voltage is applied; a package base having a base recess for mounting the piezoelectric vibrating piece; a package lid bonded onto the package base for storing the piezoelectric vibrating piece in an airtight manner; and a sealing material formed in a peripheral manner, for sealing the package base and the package lid. The sealing material is formed on a side surface of the base recess.

An eighth aspect is directed to a piezoelectric device. In its eighth aspect, the package lid comprises a lid corresponding to the package base; and the sealing materials are formed extending onto the lid recess.

A ninth aspect is directed to a piezoelectric device. In its ninth aspect, the package lid comprises a first connecting surface surrounding the lid recess; the package base comprises a second connecting surface surrounding the base recess for bonding to the first connecting surface; wherein the package lid and the package base have a rectangular shape with four sides; and wherein a relationship is described as B≤A×0.1; wherein a length of the one side is A and a width of the frame body is B.

A tenth aspect is directed to a piezoelectric device. In its tenth aspect, the sealing material is formed on the first connecting surface and the second connecting surface with a width of 5 μm or wider width than the width B of the frame body; and a distance between a side surface of the package base or the package lid to the piezoelectric device is 10 μm or larger.

According to the piezoelectric device, the leakage of gases into the cavity or outside of the cavity remains small and is shock resistant.

BRIEF DESCRIPTION OF THE DRAWINGS

FIG. 7 depicts the results of respective steps of bonding the lid wafer 11W, the quartz-crystal wafer 10W and base wafer 12W, shown in the adjacent flow-chart of FIG. 7.

DETAILED DESCRIPTION

Various embodiments are described in detail below, with reference to the accompanying drawings. In the described embodiments, an AT-cut quartz-crystal vibrating piece is used as a piezoelectric vibrating piece. The AT-cut quartz-crystal vibrating piece has a principal surface (in the YZ plane) that is tilted by 35° 15' about the Y-axis of the crystal coordinate system (XYZ) in the direction of the Y-axis direction from the Z-axis direction around the X-axis direction. Thus, in the following description, new axes tilted with respect to the axial directions of the quartz-crystal vibrating piece are denoted as the Y'-axis and Z'-axis, respectively. Therefore, in the first and second embodiments, the longitudinal direction of the quartz-crystal vibrating device is X-axis direction, the height direction is Y'-axis direction and the perpendicular direction to the X-axis direction and Y'-axis direction is Z'-axis direction.

First Embodiment

<Overall Configuration of the First Quartz-Crystal Device 100>

Figure 1:
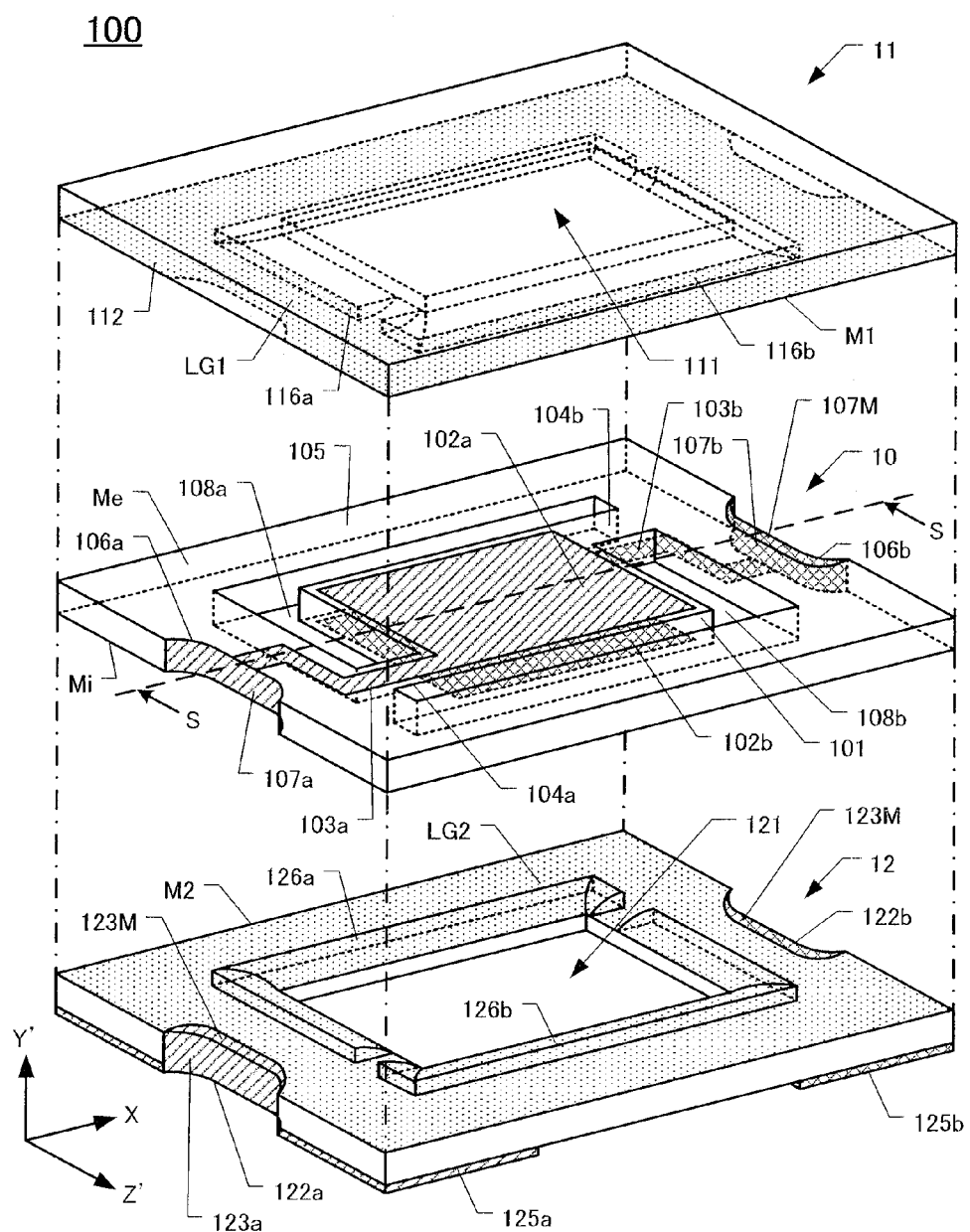
FIG. 1 is a segmented view of the first quartz-crystal vibrating device 100 in the first embodiment.
Figure 2:
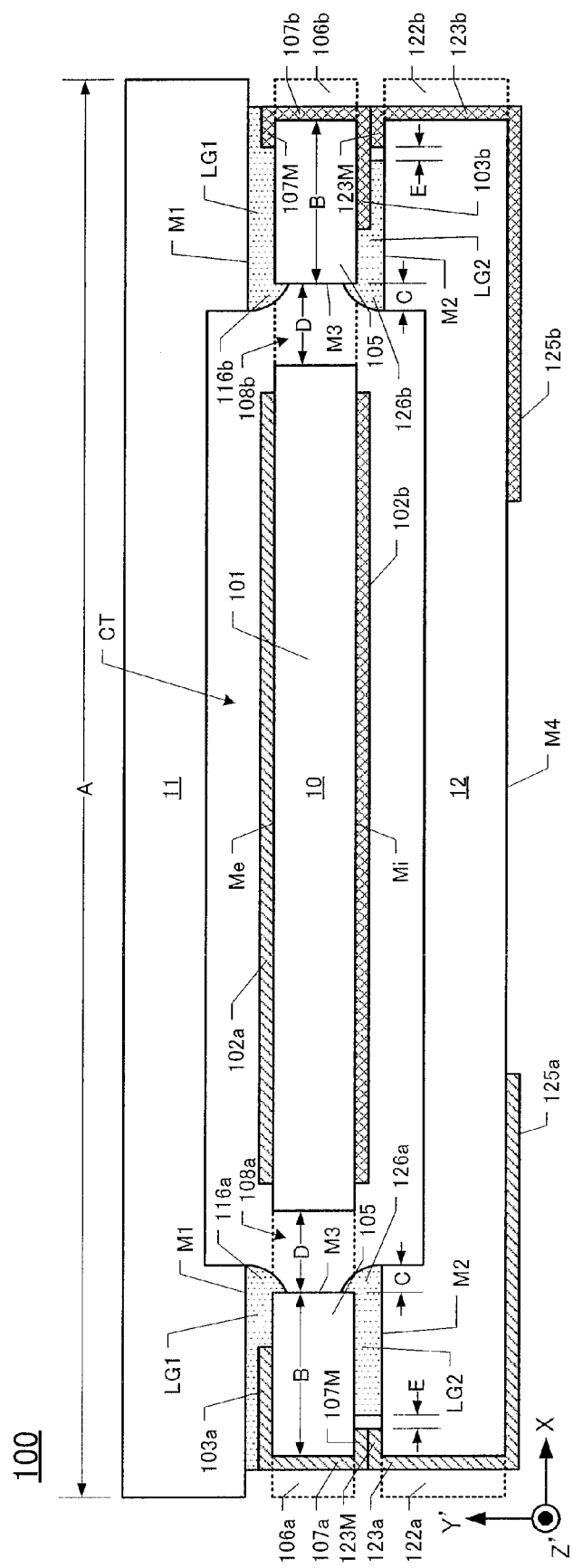
FIG. 2 is a cross-sectional view taken along S-S line.

The overall configuration of a first quartz-crystal vibrating device 100 according to this embodiment is shown in FIGS. 1 and 2. FIG. 1 is an exploded view of the first quartz-crystal vibrating device 100 and FIG. 2 is a cross-section of FIG. 1 taken along S-S line thereof.

As shown in FIGS. 1 and 2, the first quartz-crystal vibrating piece 100 includes a package lid 11 having a lid recess 111 on the inner main surface, a package base 12 having a base recess 121 on the inner main surface, and a rectangular quartz-crystal frame 10 that is sandwiched between the package lid 11 and package base 12.

The quartz-crystal frame 10 comprises a quartz-crystal vibrating portion 101 having excitation electrodes 102a and 102b situated on opposed surfaces of the quartz-crystal vibrating portion 101, and a frame body 105 surrounding the quartz-crystal vibrating portion 101. Also, a pair of supporting portions 104a and 104b is disposed in between the quartz-crystal vibrating portion 101 and the frame body 105, which is connected to the frame body 105, along both sides of the quartz-crystal vibrating portion 101 in the X-axis direction. Therefore, a pair of L-shaped through-hole openings 108a and 108b is formed between the quartz-crystal vibrating portion 101 and the frame body 105. On both sides of the quartz-crystal frame 10 disposed in the X-axis direction and extending along the Z'-axis direction, the quartz-crystal castellations 106a and 106b are formed, which are portions of the rounded-rectangular quartz-crystal through-holes CH (refer to FIG. 5). Respective quartz-crystal side surface electrodes 107a and 107b are formed on each quartz-crystal castellations 106a and 106b. Here, it is preferred that the quartz-crystal side surface electrode 107a extends to the back surface Mi of the quartz-crystal frame 10 and form a connection pad 107M. The connection pad 107M is ensured to be electrically connected to the connection pad 123M of the base side surface electrode 123a, which will be explained hereafter.

An extraction electrode 103a, extended from the excitation electrode 102a, is formed on the supporting portion 104a and the front surface Me of the frame body 105. The extraction electrode 103a is connected to the quartz-crystal side surface electrode 107a formed on the quartz-crystal castellation 106a. Similarly, an extraction electrode 103b, extended from the excitation electrode 102b, is formed on the supporting portion 104b and the back surface Mi of the frame body 105. The extraction electrode 103b is connected to the connection pad 123M of the base side surface electrode 123b, which will be explained hereafter.

As shown in FIG. 2, the length A of the quartz-crystal frame 10 in the X-axis direction is approximately 2,000 μm, and the width of the quartz-crystal frame 10 in the Z'-axis direction (not shown) is approximately 1,600 μm. Although the quartz-crystal frame 10 having outer dimension of 2,000 μm×1,600 μm is used in this specification, it can be replaced with a miniaturized quartz-crystal frame 10 having outer dimensions of 1,600 μm×1,200 μm or 1,200 μm×1,000 μm. Further, as the piezoelectric vibrating device miniaturizes, the width B of the frame body 105 becomes narrower, and narrows to 0.1×A or narrower, which calculates to 200 μm or narrower. Furthermore, the width D of the L-shaped through-hole openings 108a and 108b are preferred to be 10 μm or wider.

The package base 12 is fabricated by a glass or piezoelectric material, and the second connecting surface M2 is formed on the front surface (+Y'-axis side surface) thereof, surrounding the base recess 121. Here, the width of second connecting surface M2 has an extended width, which is wider than the width B of the frame body 105 of the quartz-crystal frame 10 by width C. This means, the width of the second connecting surface M2 of the package base 12 is defined as (B+C), wherein the width C is 5 μm or larger. Also, on both sides of the package base 12 in X-axis direction, the respective rounded-rectangular base castellations 122a and 122b are formed, which was formed while forming the base through-holes BH (refer to FIG. 6) and is recessed in the XZ'-plane. Respective pair of external electrodes 125a and 125b are formed on both sides of the mounting surface M4 (mounting surface of the quartz-crystal vibrating device) in X-axis direction of the package base 12. Also, respective base side surface electrodes 123a and 123b are formed on each castellation 122a and 122b. One end of the base side surface electrodes 123a and 123b are connected to the respective external electrodes 125a and 125b. Here, the other ends of the base side surface electrodes 123a and 123b extend to the second connecting surface M2 of the package base 12, thus forming a connection pad 123M. The connection pad 123M is ensured to be electrically connected to the quartz-crystal side surface electrode 107a and the extraction electrode 103b.

The external electrodes 125a and 125b mounted onto the package base 12 electrically connect to the respective excitation electrodes 102a and 102b by connecting through the base side surface electrodes 123a and 123b, the quartz-crystal side surface electrode 107a and extraction electrode 103b. Thus, the quartz-crystal vibrating piece 10 goes into the thickness-shear vibration mode whenever an alternating voltage (a potential that regularly alternates positives and negatives) is applied across the external electrodes 125a and 125b.

The quartz-crystal frame 10 and the package base 12 are bonded using the sealing material LG2, for example, of low-melting-point glass. The low-melting-point glass LG is a lead-free vanadium-based glass having an adhesive component that melts at 350° C. to 410° C. Vanadium-based glass can be formulated as a paste mixed with binder and solvent, and the vanadium-based glass bonds to the other materials by melting and solidifying. The vanadium-based glass resists the water vapor and humidity in the atmosphere. Also, the coefficient of thermal expansion of the vanadium-based glass can be controlled effectively by controlling its glass structure.

In the first embodiment, the width B of the frame body 105 on the quartz-crystal frame 10 is narrower than the width (B+C) of the second connecting surface M2 of the package base 12. Therefore, whenever the quartz-crystal frame 10 and base 12 are pressed together, the low-melting-point glass LG2, formed onto the second connecting surface M2 of the package base 12, becomes thinner on the corresponding portion to the frame body 105 of the quartz-crystal frame 10 and to the supporting arms 104a and 104b. On the other hand, the low-melting-point glass LG2, formed on the corresponding portion to the width C and was not pressed against the frame body 105 of the quartz-crystal frame 10, does not become thinner, and is raised toward the side surface M3 of the through-hole openings 108a and 108b. Thus the low-melting-point glass LG2 forms a raised low-melting-point glass regions 108a and 108b, in which the shape thereof corresponds to the through-hole openings 126a and 126b, as shown in FIGS. 1 and 2.

The first quartz-crystal vibrating device 100 further comprises the package lid 11 made of the glass or piezoelectric material of quartz-crystal, which is bonded to the top surface Me of the quartz-crystal frame 10. The package lid 11 comprises the first connecting surface M1 surrounding the lid recess 111. Here, the width of the first connecting surface M1 includes the width C which is wider width than the width B on the frame body 105 of the quartz-crystal frame 10. Therefore, the width of the second connecting surface M2 of the package base 12 is (B+C), wherein the width C is 5 μm or larger.

Also, as shown in FIG. 2, the cavity CT for storing the quartz-crystal vibrating portion 101 of the quartz-crystal frame 10 is formed by bonding the package lid 11, the frame body 105 of the quartz-crystal frame 10, and the base 12. The cavity CT is filled with nitrogen gas or in a vacuum.

The package lid 11 and quartz-crystal frame 10 are bonded using the sealing material of low-melting-point glass LG1, for example. The width B of the frame body 105 on the quartz-crystal frame 10 is formed narrower than the width (B+C) of the first connecting surface M1 of the package lid 11. Therefore, whenever the package lid 11 is pressed against the quartz-crystal frame 10, the first low-melting-point glass LG1, formed onto the first edge surface M1, becomes thinner on the corresponding portions to the quartz-crystal frame 10 and the supporting portions 104a and 104b. On the other hand, the low-melting-point glass LG1, formed on the corresponding portion to the width C and was not pressed against the frame body 105 of the quartz-crystal frame 10, does not become thinner, and is raised toward the side surface M3 of the through-hole openings 108a and 108b. Thus the low-melting-point glass LG1 forms a raised low-melting-point glass regions 116a and 116b, in which the shape thereof corresponds to the through-hole openings 108a and 108b, as shown in FIGS. 1 and 2.

In the first embodiment, the raised low-melting-point regions 116a and 116b of the package lid 11 and the raised low-melting-point regions 126a and 126b of the package base 12 do not need to be always connected.

According to this configuration, even if the frame body 105 of the quartz-crystal frame 10 is quite narrow, the presence of the raised low-melting-point regions 116a and 116b, and the raised low-melting-point regions 126a and 126b ensure the quartz-crystal frame 10 is securely bonded to the package lid 11 and package base 12 with a larger connecting area. Therefore, the connecting area becomes larger by the amount of the raised low-melting-point regions, and thus prevents the leakage of water vapor or gas from outside of the quartz-crystal vibrating device 100 to the cavity CT or from the cavity CT to the outside of the first quartz-crystal vibrating device 100. Further, the first quartz-crystal vibrating device 100 becomes shock-resistant.

Figure 3:
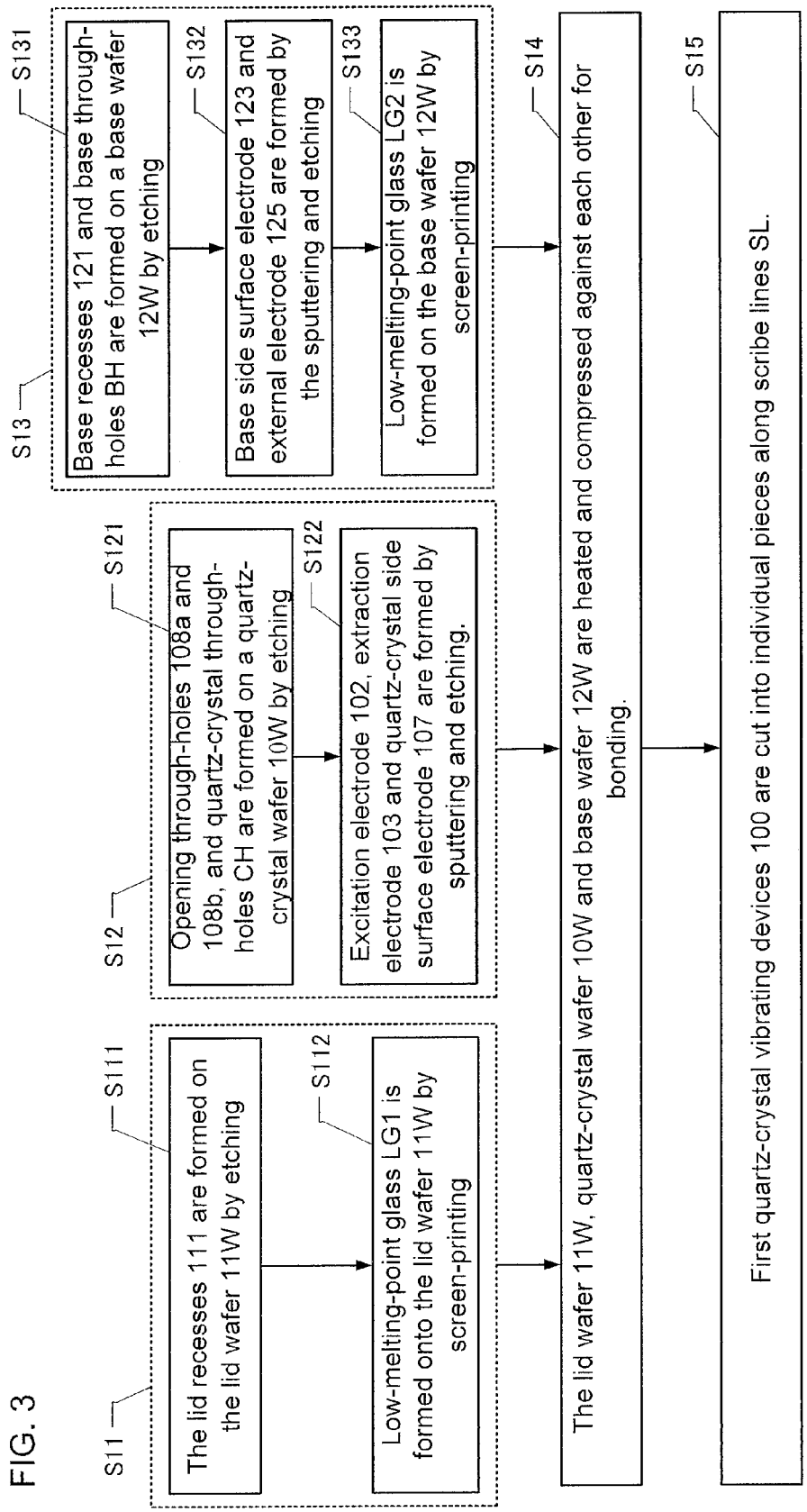
FIG. 3 is a flow-chart showing the manufacturing method of the first quartz-crystal vibrating device 100 in the first embodiment.
Figure 5:
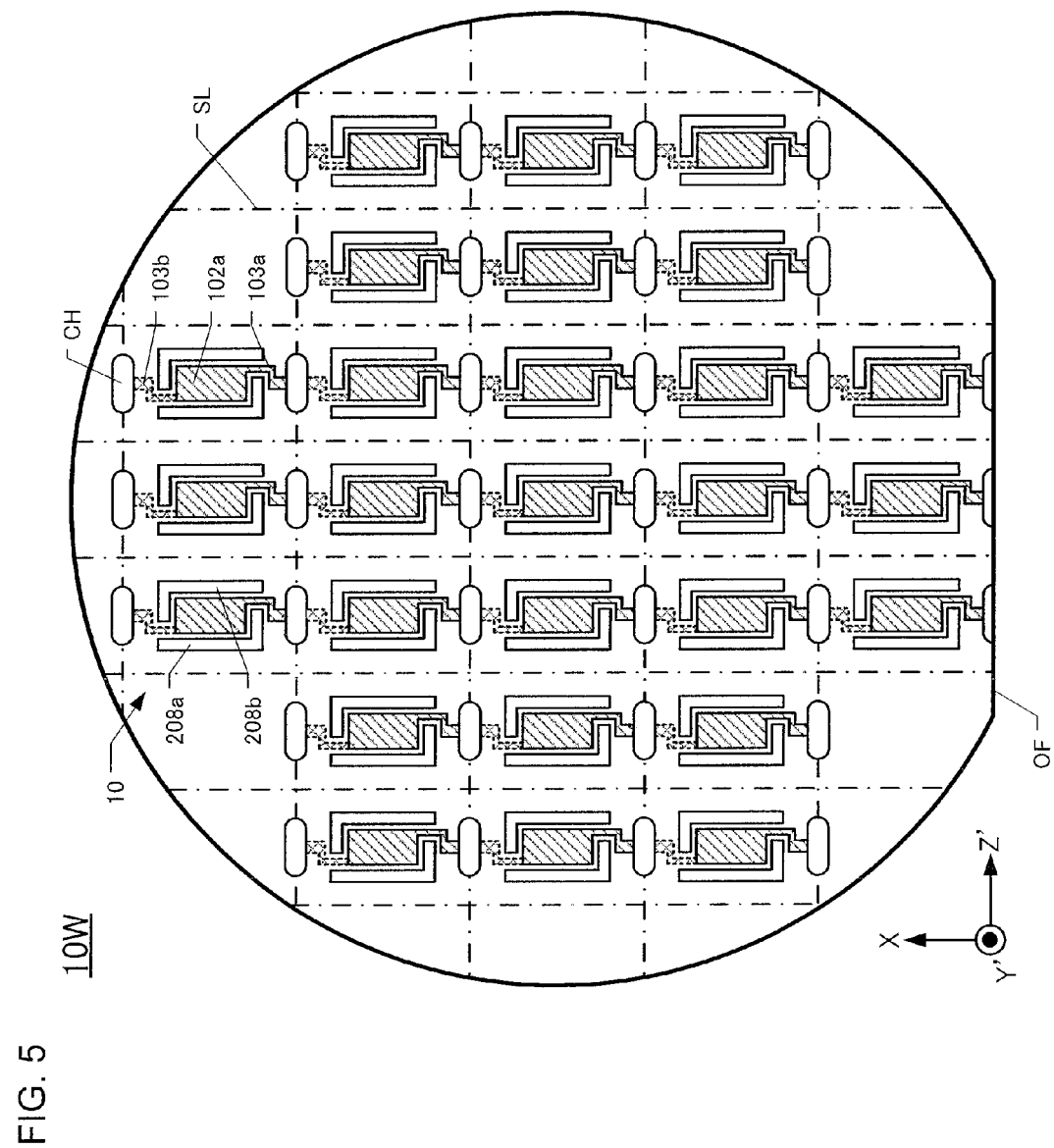
FIG. 5 is a plan view of the quartz-crystal wafer 10W.
Figure 6:
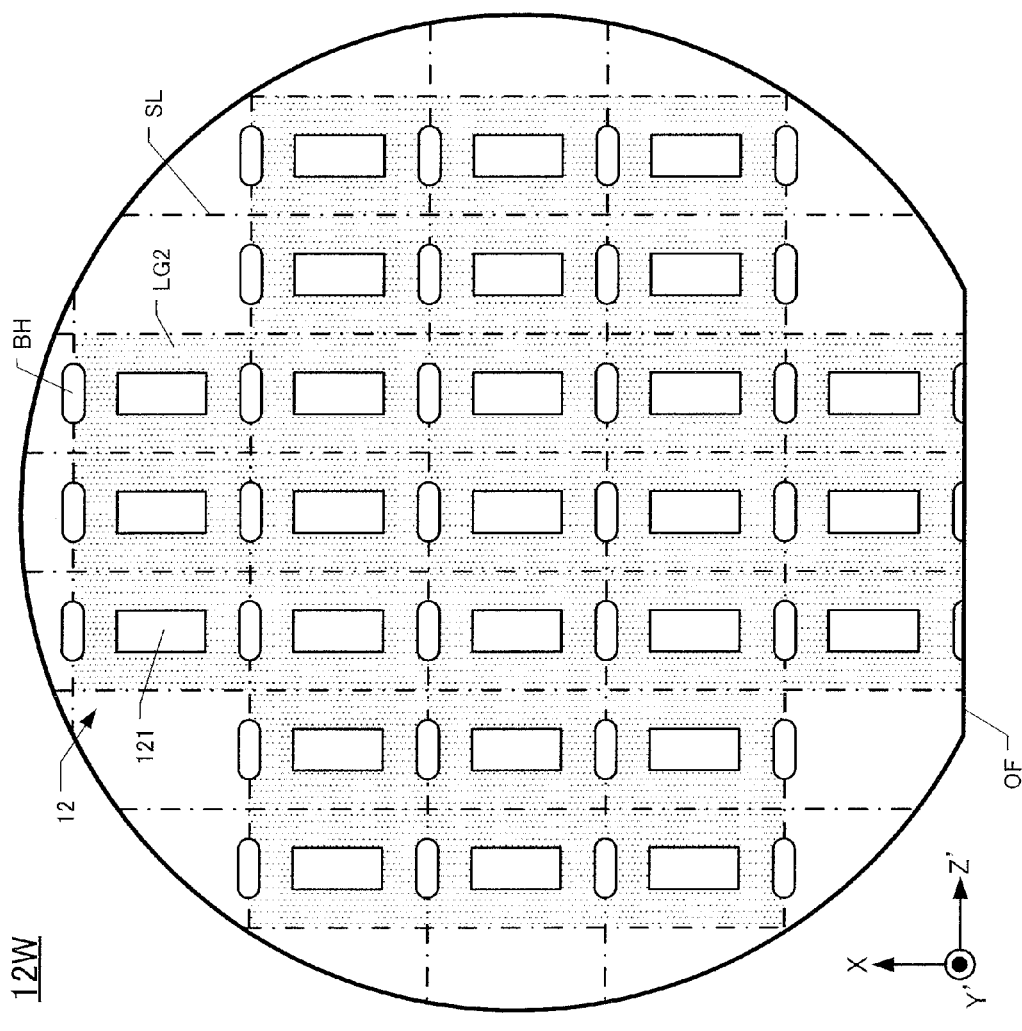
FIG. 6 is a plan view of the base wafer 12W.

FIG. 3 is a flow-chart showing the manufacturing method of the first quartz-crystal vibrating device 100. In FIG. 3, protocol S11 for manufacturing the package lid 11, protocol S12 for manufacturing the quartz-crystal frame 10 and protocol S13 for manufacturing the package base 12 can be carried out separately or in parallel. Also, FIG. 4 is a plan view of the lid wafer 11W in the first embodiment, FIG. 5 is a plan view of the quartz-crystal wafer 20W, and FIG. 6 is a base wafer 12W.

In protocol S11, the package lid 11 is manufactured. Protocol S11 includes steps S111 and S112.

Figure 4:
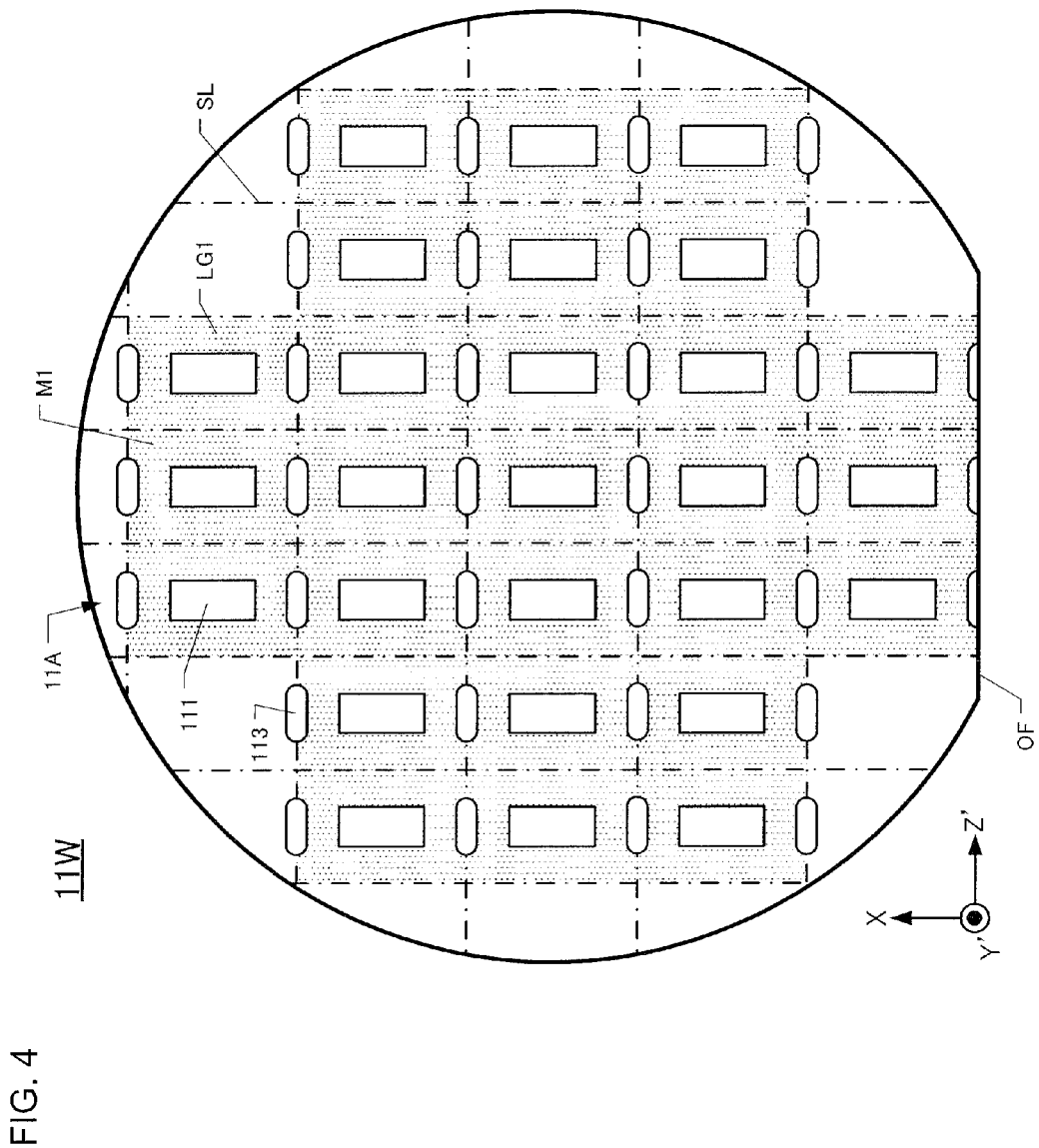
FIG. 4 is a plan view of the lid wafer 11W.

In step S111, as shown in FIG. 4, several hundreds to several thousands of lid recess 111 are formed simultaneously on a lid wafer 11W, which is a circular, uniformly planar plate of quartz-crystal material. The lid recesses 111 are formed on the lid wafer 11W by etching or mechanical processing, and the first connecting surfaces M1 are formed extending around the periphery of the lid recess 111.

In step S112, as shown in FIG. 4, the low-melting-point glass LG1 is formed onto the first connecting surface M1 of the lid wafer 11W by screen-printing. Then the low-melting-point glass LG1 is formed on the first connecting surface M1 of the lid wafer 11W by a preliminary curing of the low-melting-point glass LG. The low-melting-point glass is not formed on the position 113 which corresponds to the quartz-crystal through-holes CH, which is divided to form quartz-crystal castellations 106a and 106b. Here, the thickness G (refer to FIG. 7) of the low-melting-point glass LG1 has a thickness greater than the thickness of the connection pad 107M.

In protocol S12, the quartz-crystal frame 10 is manufactured. Protocol S12 includes steps S121 and S122.

In step S121, as shown in FIG. 5, multiple outlines of quartz-crystal frames 10 are formed on a quartz-crystal wafer 10W by etching, which is a circular, uniformly planar plate of quartz-crystal material. Thus, the quartz-crystal vibrating portion 101, the outer frame 105, the pair of through-hole openings 108a and 108b are formed. Similarly, on both sides of each quartz-crystal frame 10 in X-axis directions, rounded-rectangular quartz-crystal through-holes CH are formed that completely cuts through the quartz-crystal wafer 10W. Whenever the quartz-crystal through-holes CH are divided in half, it forms one of the quartz-crystal castellations 106a and 106b (refer to FIG. 1).

In step S122, a metal layer is formed on both surfaces of the quartz-crystal wafer 10W and the quartz-crystal through-hole CH by sputtering or vacuum-deposition. Then, a photoresist is applied uniformly on entire surface of the metal layer. Using an exposure tool (not shown), outline patterns of excitation electrodes 102a and 102b, extraction electrodes 103a and 103b, and quartz-crystal side surface electrodes 107a and 107b are imprinted in the quartz-crystal wafer 10W. Next, the exposed metal layers from the photoresist are etched. Thus, the excitation electrodes 102a and 102b, and extraction electrodes 103a and 103b are formed on both surfaces of the quartz-crystal wafer 10W, and the quartz-crystal side surface electrodes 107a and 107b are formed on the quartz-crystal through-holes CH (refer to FIGS. 1 and 2).

In protocol S13, the package base 12 is manufactured. Protocol S13 includes steps S131 to S133.

In step S131, as shown in FIG. 6, multiple outlines of base recesses 121 are formed on a base wafer 12W, which is a circular, uniformly planar plate of quartz-crystal material. The base recesses 121 are formed on the base wafer 12W by etching or mechanical processing, and the second connecting surfaces M2 are formed extending around the periphery of the base recess 121. At the same time, on each corners of the package base 12, a circular base through-holes BH are formed that completely cuts through the base wafer 12W. Whenever the base through-holes BH are divided in half, it forms one of the base castellations 122a and 122b (refer to FIG. 1).

In step S132, as shown in FIG. 6, a pair of external electrodes 125a and 125b are formed on the mounting surface of the package base 12 using the sputtering and etching method explained in step S122. On the base through-holes BH, the base side surface electrodes 123a and 123b are formed simultaneously (refer to FIGS. 1 and 2).

In step S133, a low-melting-point glass LG2 is formed as a sealing material on the second connecting surface M2 of the base wafer 12W by screen-printing. Then, the low-melting-point glass LG2 is formed on the second connecting surface M2 of the base wafer 12W by preliminary curing of the low-melting-point glass LG2.

Here, the thickness G (refer to FIG. 7A) of the low-melting-point glass LG2 is formed thicker than the total thickness of the connection pad 107M and 123M. Also, the low-melting-point glass LG2 is separated from the connection pad 123M by a distance F (refer to FIG. 7).

In step S14, the low-melting-point glasses LG1 and LG2 are heated, and the lid wafer 11W, quartz-crystal wafer 10W and base wafer 12W are compressed against each other for bonding. The procedure is explained using FIG. 7 as reference. FIG. 7 depicts the results of respective steps of bonding the lid wafer 11W, the quartz-crystal wafer 10W and base wafer 12W. The flow-chart on left side of the FIG. 7 explains the step S14 in detail, and the right side is a cross-sectional view taken along A-A line of FIG. 1, that corresponds to each step on the flow-chart.

In step S141, positions of the quartz-crystal wafer 10W and the base wafer 12W are determined. To facilitate co-alignment, the quartz-crystal wafer 10W in FIG. 5 and the base wafer 12W in FIG. 6 include a respective orientation flat OF on outer edge of each wafer, to provide a reference identifying the direction of the crystal lattice. Using the orientation flats OF as alignment references, the quartz-crystal wafer 10W manufactured in protocol S12 and the base wafer 12W manufactured in protocol S13 are stacked precisely.

In step S142, the low-melting-point glass LG2 is heated at a temperature in the range of 350° C. to 410° C., and the quartz-crystal wafer 10W is compressed against the base wafer 12W for bonding. Here, the quartz-crystal wafer 10W is compressed until the connection pad 107M of the quartz-crystal wafer 10W and the connection pad 123M of the base wafer 12W are bonded without forming intervening gaps. Since the thickness G of the low-melting-point glass LG2 is thicker than total thickness of the connection pads 107M and 123M, the low-melting-point glass LG2 is compressed against the frame body 105 of the quartz-crystal wafer 10W, thus makes a part of the low-melting-point glass LG2 thinner. The low-melting-point glass has predefined viscosity, and thus raises the low-melting-point glass regions 126a and 126b (refer to FIG. 2) toward the side surface M3 on the through-hole openings 108a and 108b of the quartz-crystal wafer 10W. Also, whenever the low-melting-point glass LG2 is pressed, it spreads in the XZ'-plane. Since the low-melting-point glass LG2 is formed away from the connection pad 123M by a distance F, the predetermined interval E between the connection pads 107M and 123M can be maintained even if the low-melting-point glass LG2 spreads in the XZ'-plane.

In step S143, positions of the quartz-crystal wafer 10W and the base wafer 12W are determined. To facilitate co-alignment, the lid wafer 11W in FIG. 4 and the quartz-crystal wafer 10W in FIG. 5 include a respective orientation flat OF on outer edge of each wafer, to provide a reference identifying the direction of the crystal lattice. Using the orientation flats OF as alignment references, the lid wafer 11W manufactured in protocol S11 and the quartz-crystal wafer 10W and the base wafer 12W bonded in the step S142 are stacked precisely.

In step S144, the low-melting-point glass LG1 is heated at a temperature in the range of 350° C. to 410° C., and the lid wafer 11W is compressed against the quartz-crystal wafer 10W for bonding. Thus, the lid wafer 11W and the quartz-crystal wafer 10W are bonded. Since the thickness G of the low-melting-point glass LG1 is thicker than thickness of the connection pad 107M, the low-melting-point glass LG1 is compressed against the frame body 105 of the quartz-crystal wafer 10W, thus makes a part of the low-melting-point glass LG1 thinner. Thus, the low-melting-point glass regions 116a and 116b (refer to FIG. 2) are raised toward the side surface M3 on the openings 108a and 108b of the quartz-crystal wafer 10W.

In step S15 of FIG. 3, the lid wafer 11W, quartz-crystal wafer 10W and base wafer 12W bonded together is cut into individual quartz-crystal vibrating devices 100. Cutting is performed along scribe lines SL, denoted by dot-dash lines in FIGS. 4 to 6 using a dicing unit such as a laser beam or a dicing saw. Thus, several hundreds to several thousands of quartz-crystal vibrating devices 100 are produced.

Alternative to the First Embodiment

Figure 8:
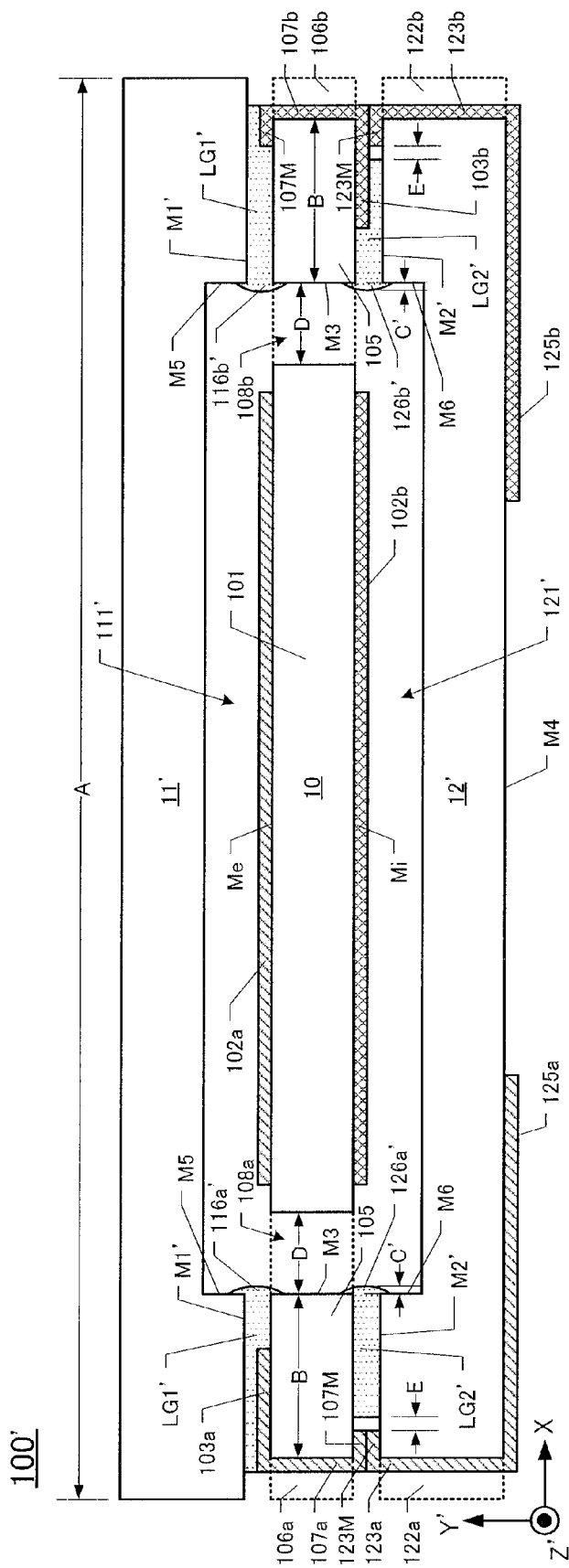
FIG. 8 is a cross-sectional view of the first quartz-crystal vibrating device 100' in the alternative to the first embodiment, taken along the line corresponding to the S-S line in FIG. 1.

Overall configuration of the alternative to the first embodiment of the first quartz-crystal vibrating device 100' is explained using FIG. 8 as a reference. FIG. 8 is a cross-sectional view of the first quartz-crystal vibrating device 100', which is alternative to the first embodiment, taken along S-S line of FIG. 1.

As shown in FIG. 8, the first quartz-crystal vibrating device 100' includes a package lid 11' having a lid recess 111' on an inner main surface, a package base 12' having a base recess 121' on an inner main surface, and a quartz-crystal frame 10 that is sandwiched between the package lid 11' and package base 12'.

In the alternative to the first embodiment, the first cross-section M1' formed surrounding the lid recess 111' of the lid portion 11', the frame body 105 of the quartz-crystal frame 10 and the second cross-section M2' formed surrounding the base recess 121' of the base portion 12' all have the same width. Therefore, the side surface M5 of the lid recess 111', the side surface M3 of the through-hole openings 108a and 108b, and the side surface M6 of the base recess 121' are all aligned in the Y'-axis directions. However, because cross-sectional view of FIG. 8 goes through the castellations, the actual widths of the first cross-section M1', the frame body 105 and the second cross-section M2 are indicated in dotted lines.

Thus, whenever the quartz-crystal frame 10 and the package base 12' are compressed against each other, the low-melting-point glass LG2' having a predetermined viscosity is raised toward the side surface M3 of the through-hole openings 108a and 108b, and toward the side surface M6 of the base recess 121', thus forming the side low-melting-point glass regions 126a' and 126b'. Similarly, whenever the package lid 11' and the quartz-crystal frame 10 are compressed against each other, the low-melting-point glass LG1' having a predetermined viscosity is raised toward the side surface M5 of the lid recess 111' and toward the side surface M3 of the through-hole openings 108a and 108b, thus forming the side low-melting-point glass regions 116a' and 116b'. Here, the thickness C' of the low-melting-point glass regions 116a', 116b', 126a' and 126b' is 5 μm or thicker.

According to this configuration, even if the frame body 105 of the quartz-crystal frame 10 is quite narrow, the raised low-melting-point glass regions 116a', 116b', 126a' and 126b' ensure a secure bond between the quartz-crystal frame 10, the package lid 11' and the package base 12' having a larger connecting area. Therefore, the leakage of atmosphere from outside of the first quartz-crystal vibrating device 100' into the cavity CT or the reverse is unlikely to occur, and also makes the first quartz-crystal vibrating device 100' shock-resistant. The manufacturing method of the first quartz-crystal vibrating device 100' follows the flow-chart in FIG. 3.

Second Embodiment

<Overall Configuration of the Second Quartz-Crystal Vibrating Device 200>

Figure 9:
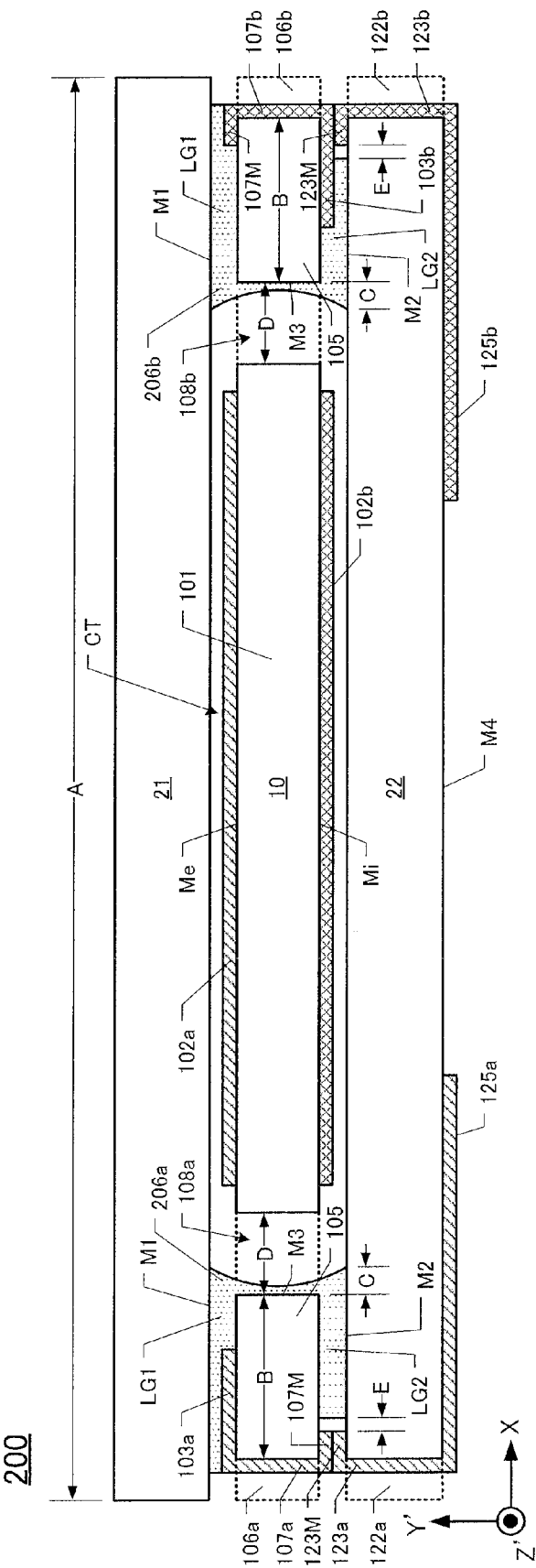
FIG. 9 is a cross-sectional view of the second quartz-crystal vibrating device 200 in the second embodiment, taken along the line corresponding to the S-S line in FIG. 1.

The overall configuration of the second quartz-crystal vibrating device 200 is explained using FIG. 9 as a reference. FIG. 9 is a cross-section of the second quartz-crystal vibrating device 200, which corresponds to the S-S line of FIG. 1 in the first embodiment. In this embodiment, components that are similar to corresponding components in the first embodiment have the same reference numerals.

As shown in FIG. 9, the second quartz-crystal vibrating device 200 includes a quartz-crystal frame 10 that is sandwiched between a package lid 21 and a package base 22. Contrary to the first embodiment, the package lid 21 and the package base 22 have a planar shape without a recessed portion.

Also, in the second embodiment, the raised low-melting-point glass region 116a explained in the first embodiment combines with the raised low-melting-point region 126a (refer to FIG. 2), thus forming the low-melting-point glass region 206a which is combined from top to bottom. Similarly the raised low-melting-point glass 116b combines with the raised low-melting-point region 126b (refer to FIG. 2), thus forming the low-melting-point region 206b, which is combined from top to bottom.

According to this configuration, even if the frame body 105 on the quartz-crystal frame 10 is quite narrow, the raised low-melting-point glass regions 206a and 206b ensure a secure bond between the package lid 21 and package base 22 with a larger connecting area. Therefore, the leakage of atmosphere from outside of the second quartz-crystal vibrating device 200 into the cavity CT or the reverse is unlikely to occur, thus making the second quartz-crystal vibrating device 200 shock-resistant.

In the second embodiment, since the recess portions on the package lid 21 and package base 22 are absent, the quartz-crystal vibrating piece can be formed as inverse mesa-type, to prevent adverse effect against the vibration of the quartz-crystal vibrating portion.

<Manufacturing Method of the Second Quartz-Crystal Vibrating Device 200>

The manufacturing method of the second quartz-crystal vibrating device 200 is explained using FIG. 3 in the first embodiment as a reference.

In the protocol S11 for manufacturing the package lid 21, step S111 for forming the recess is not necessary, and instead, the low-melting-point glass LG1 is formed on the lid wafer, which corresponds to the frame body 105 of the piezoelectric frame 10.

The protocol S12 for manufacturing the quartz-crystal frame 10 follows the same method as the first embodiment.

In the protocol S13 for manufacturing the package base 22, although the base through-holes BH are formed in the step S131, the base recess 121 is not formed. Then, respective electrodes are formed in the step S132, and the low-melting-point glass LG2 having corresponding shape to the frame body 105 of the quartz-crystal frame 10 is formed on the base wafer.

In step S14, the lid wafer, quartz-crystal wafer and base wafer are bonded together. Here, the low-melting-point glass regions 116a and 116b (refer to FIG. 2) formed on the lid wafer and the low-melting-point glass regions 126a and 126b (refer to FIG. 2) formed on the base wafer are raised and combined for bonding. Thus, the low-melting-point glass regions 206a and 206b (refer to FIG. 9) are formed on the side surface M3 of the through-hole openings 108a and 108b.

Step S15 follows the same method as the first embodiment.

Third Embodiment

<Overall Configuration of the Third Quartz-Crystal Vibrating Device 300>

Figure 10:
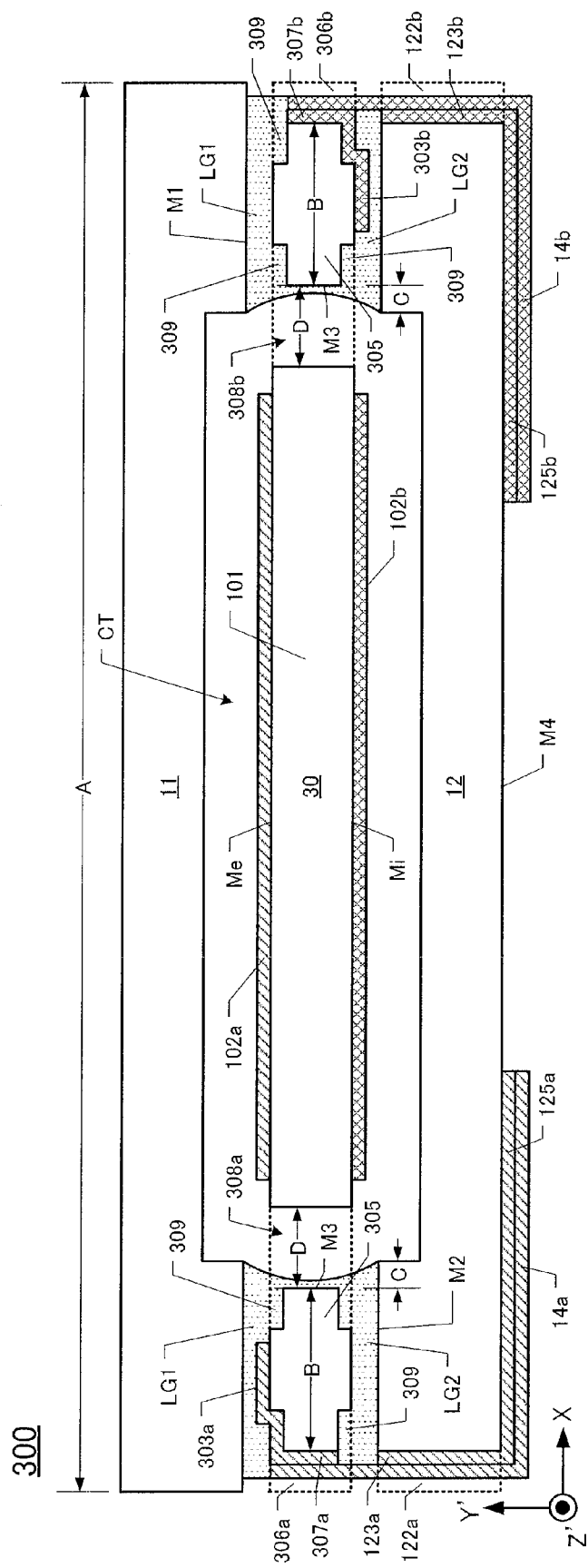
FIG. 10 is a cross-sectional view of the third quartz-crystal vibrating device 300 in the third embodiment, taken along the line corresponding to the S-S line in FIG. 1.

The overall configuration of the third quartz-crystal vibrating device 300 is explained using FIG. 10 as a reference. FIG. 10 is a cross-section of the third quartz-crystal vibrating device 300, which corresponds to the S-S line of FIG. 1 in the first embodiment. In this embodiment, components that are similar to corresponding components in the first embodiment have the same reference numerals.

As shown in FIG. 10, the third quartz-crystal vibrating device 300 includes a quartz-crystal frame 30 sandwiched between the package lid 11 and package base 12. In the third embodiment, a frame body 305 in the quartz-crystal frame 30 comprises a step portion 309 on inner side surface (quartz-crystal vibrating portion side) and the outer side surface (castellation side) that is recessed from the front surface Me and the back surface Mi. This step portion provides a larger area of the pair of through-hole openings 308a and 308b. According to this configuration, the low-melting-point glasses LG1 and LG2 formed on the respective through-hole openings 308a and 308b ensure a secure bond between the package lid 11, quartz-crystal frame 30 and package base 12 with a large connecting area.

According to this configuration, even if the frame body 305 on the quartz-crystal frame 30 is quite narrow, the quartz-crystal frame 30 are ensured to be securely bonded to the package lid 11 and package base 12 with a larger connecting area. Therefore, the leakage of atmosphere from outside of the third quartz-crystal vibrating device 300 into the cavity CT or the reverse is unlikely to occur, thus making the third quartz-crystal vibrating device 300 shock-resistant.

Also, a center of the frame body 305 of the quartz-crystal frame 30 has a thickness greater than both sides. This means, since the sides of the quartz-crystal castellations are formed thinner than the center, the quartz-crystal side surface electrode 307a and the base side surface electrode 123a may not be ensured to be electrically connected. Therefore, on the quartz-crystal frame 30 in the third embodiment, the connecting electrodes 14a and 14b are formed on the outer surface, so as to cover a part of or the entire external electrodes 125a and 125b, the base side surface electrodes 123a and 123b and the quartz-crystal side surface electrodes 107a and 107b. Therefore, the external electrodes 125a and 125b are ensured to be electrically connected to the respective excitation electrodes 102a and 102b by connecting through the respective base side surface electrodes 123a and 123b, connecting electrodes 14a and 14b, quartz-crystal side surface electrodes 107a and 107b and extraction electrodes 303a and 303b.

Although the respective connecting electrodes 14a and 14b are formed on the respective external electrodes 125a and 125b in the third embodiment, it can be formed only on the base side surface electrodes 123a and 123b, and the quartz-crystal side surface electrodes 107a and 107b.

<Manufacturing Method of the Third Quartz-Crystal Vibrating Device 300>

Manufacturing method of the third quartz-crystal vibrating device 300 is explained using FIGS. 3 and 7 in the first embodiment as references.

Protocol S11 for manufacturing the package lid 11 and protocol S13 for manufacturing the package base follows the same method as the first embodiment.

In the step S121 of protocol S12 of manufacturing the quartz-crystal frame 30, the through-hole openings 308a and 308b, the quartz-crystal castellations 306a and 306b, and a step portion 309 are formed by etching. Then, the excitation electrodes 102a and 102b, and extraction electrodes 103a and 103b are formed in step S122.

In step S14, the lid wafer, quartz-crystal wafer and base wafer are bonded together. The connecting electrodes 14a and 14b are formed after bonding the quartz-crystal wafer and the base wafer together. The connecting electrodes 14a and 14b are formed so as to cover a part or all of the external electrodes 125a and 125b, base side surface electrodes 123a and 123b and the quartz-crystal side surface electrodes 107a and 107b. The quartz-crystal wafer and the base wafer are bonded, in which the quartz-crystal wafer faces downward. Then, a mask (not drawn) with openings are formed on the mounting surface M4 of the base wafer on the position corresponding to the external electrodes 125a and 125b and the base through-holes BH. The connecting electrodes 14a and 14b are formed by sputtering or vacuum-deposition. Therefore, the respective base side surface electrodes 123a and 123b are ensured to be connected to the quartz-crystal side surface electrodes 107a and 107b.

In step S15, the lid wafer, quartz-crystal wafer and base wafer bonded together is cut into individual quartz-crystal vibrating devices. Thus, several hundreds to several thousands of quartz-crystal vibrating devices 300 are manufactured.

Fourth Embodiment

<Overall Configuration of the Quartz-Crystal Vibrating Device>

Figure 11:
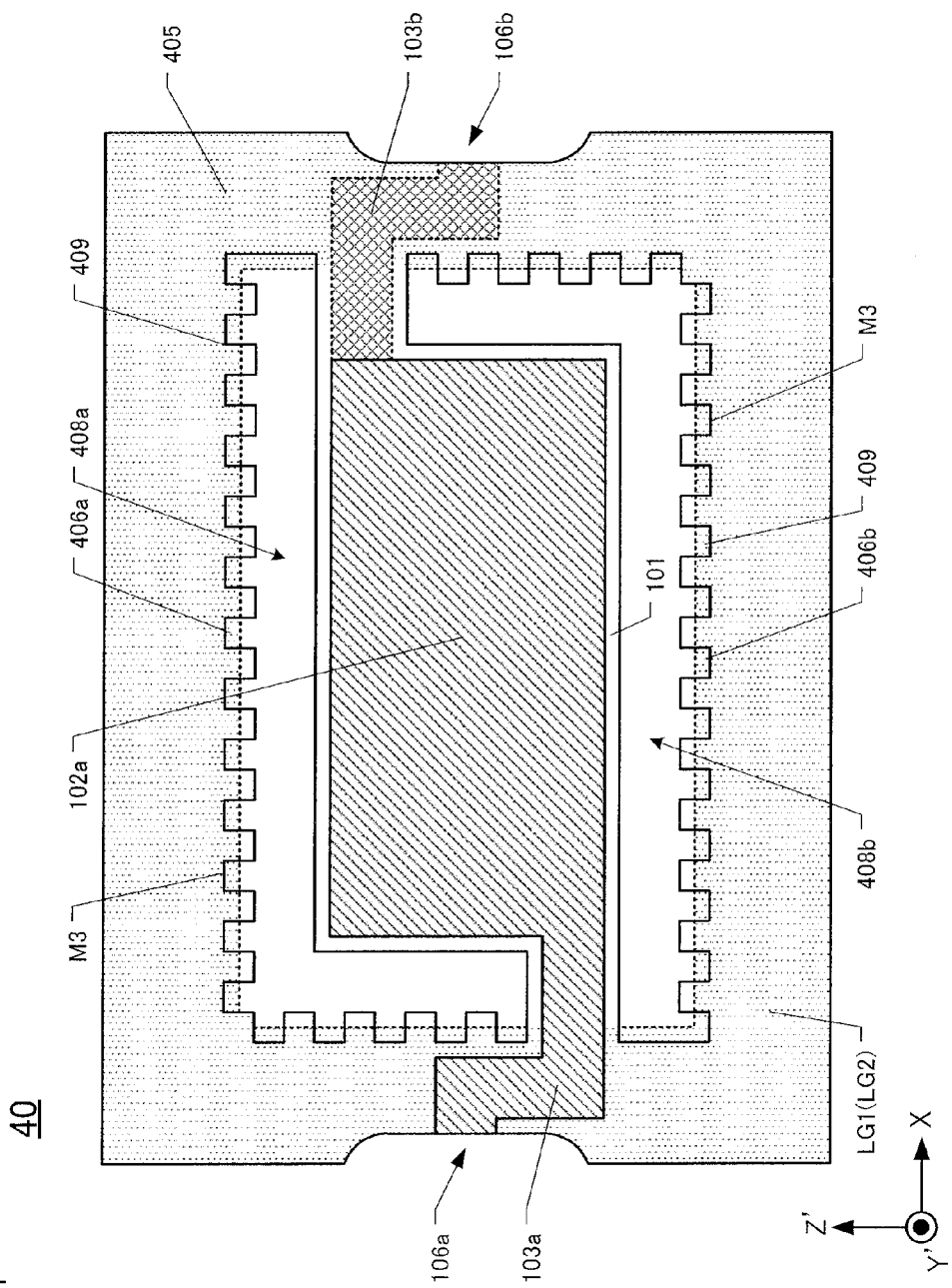
FIG. 11 is a plan view of the quartz-crystal frame 40 in the fourth embodiment.

The quartz-crystal vibrating device (not drawn) in the fourth embodiment includes a package lid 11, a package base 12 and a quartz-crystal frame 40 sandwiched between the package lid 11 and package base 12. The quartz-crystal frame 40 is explained using FIG. 11 as a reference. FIG. 11 is a plan view of the quartz-crystal frame 40. Although it is not present on the quartz-crystal frame 40, the low-melting-point glass LG1 is drawn between the package lid 11 and quartz-crystal frame 40, and the low-melting-point glass LG2 is drawn between the quartz-crystal frame 40 and the package base 12, to provide better understanding.

As shown in FIG. 11, the quartz-crystal frame 40 comprises a pair of through-hole openings 408a and 408b formed in an L-shape. The pair of through-hole openings 408a and 408b includes a plurality of grooves 409 formed continuously on the side surface M3 of the frame body 405.

Also, whenever the package lid 11, the quartz-crystal frame 40 and the package base 12 are bonded together using the low-melting-point glasses LG1 and LG2, the low-melting-point glasses LG1 and LG2 are raised toward and into the grooves 409 on the through-hole openings 408a and 408b in the XZ'-plane, forming the low-melting-point glass region 406a, 406b. Here, the raised low-melting-point glass region 406a, 406b can be placed apart in the Z-axis direction, as explained in the first embodiment, or can be combined in the Z-axis direction, as shown in the second and third embodiments.

According to this configuration, even if the frame body 405 on the quartz-crystal frame 40 is formed narrow, the quartz-crystal frame 40 are ensured to be bonded to the package lid and package base with large connecting area. Therefore, the leakage of atmosphere from outside of the third quartz-crystal vibrating device 400 to the cavity CT or the reverse is unlikely to be occurred, thus makes the third quartz-crystal vibrating device 400 shock-resistant.

<Manufacturing Method of the Quartz-Crystal Vibrating Device in the Fourth Embodiment>

Manufacturing method of the quartz-crystal vibrating device in the fourth embodiment follows the flow-chart of FIG. 3, and explanations are omitted.

Fifth Embodiment

<Overall Configuration of the Fifth Quartz-Crystal Vibrating Device 500>

Figure 12:
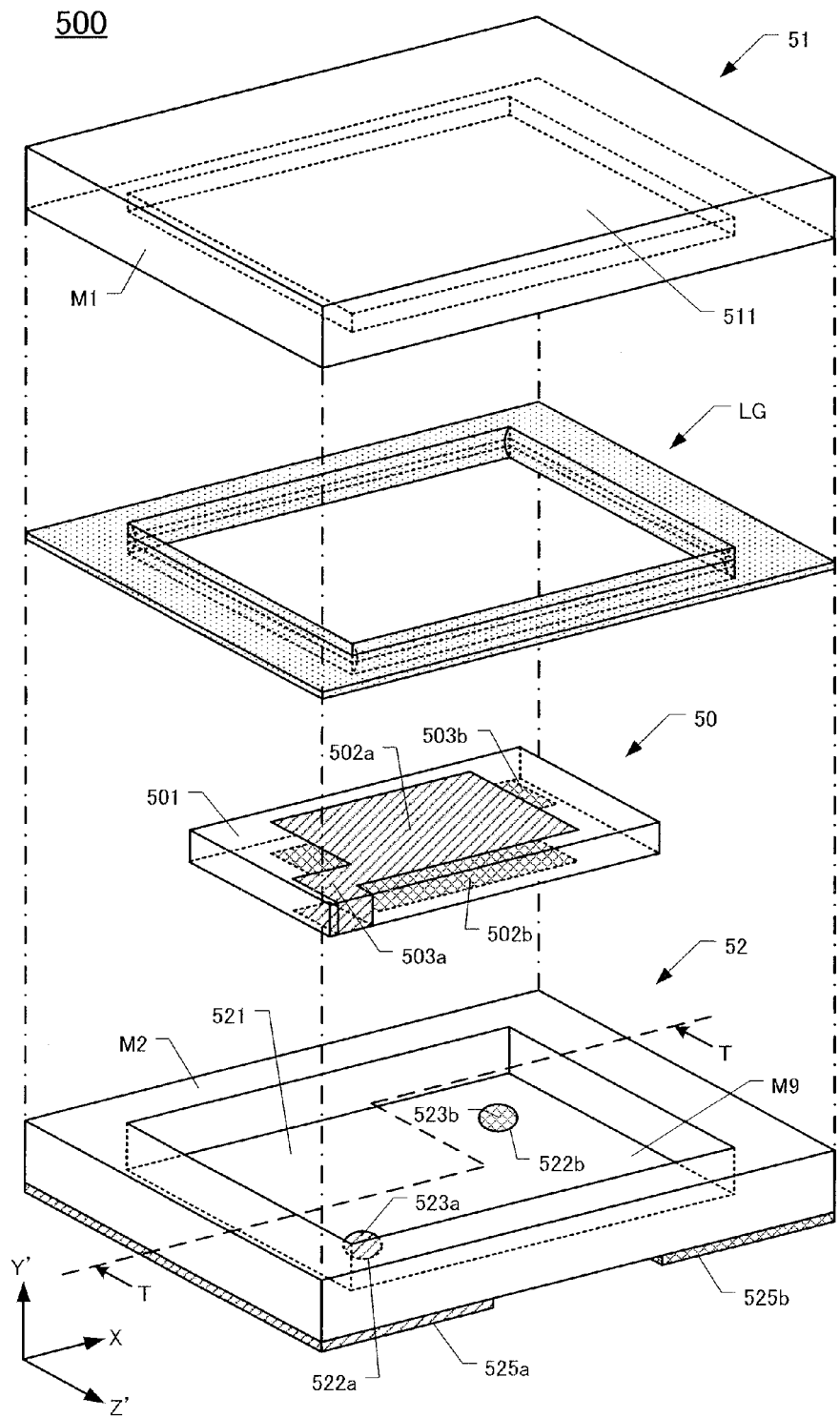
FIG. 12 is a segmented view of the fifth quartz-crystal vibrating device 500 in the fifth embodiment.
Figure 13:
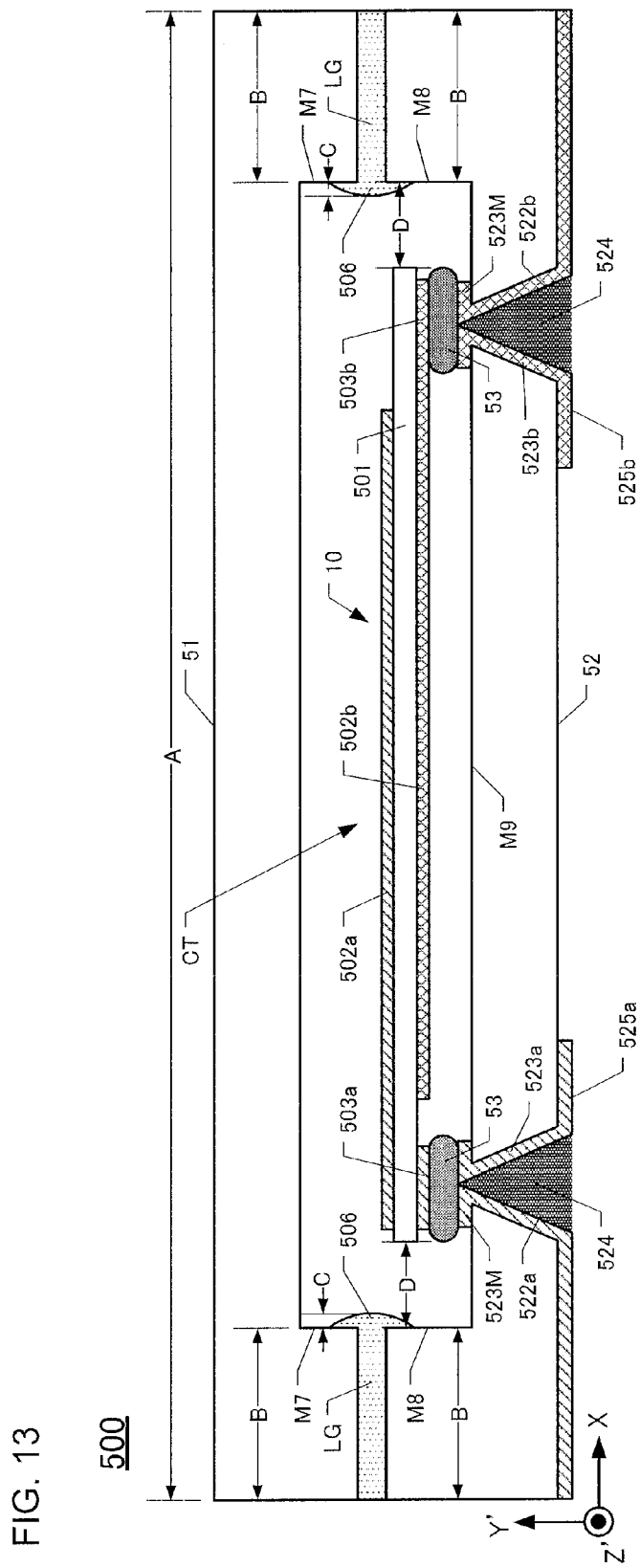
FIG. 13 is a cross-sectional view of FIG. 12 taken along T-T line.

Overall configurations of the fifth quartz-crystal vibrating device 500 are explained using FIGS. 12 and 13 as references. FIG. 12 is an exploded view of the fifth quartz-crystal vibrating device 500 in the fifth embodiment, and FIG. 13 is a cross-section of FIG. 12 taken along line T-T thereof.

As shown in FIGS. 12 and 13, the fifth quartz-crystal vibrating device 500 includes a package lid 51 having a lid recess 511 on an inner main surface, a package base 52 having a base recess 521 on an inner main surface, and a rectangular quartz-crystal frame 50 that is sandwiched between the package lid 51 and package base 52.

The quartz-crystal vibrating piece 50 includes a quartz-crystal piece 501, and a pair of excitation electrodes 592 and 502b are formed on the center of both principal surfaces of the quartz-crystal piece 501 so as to oppose each other. Also, an extraction electrode 503a, which extends to one end of the bottom surface of the quartz-crystal piece 501 in −X-side and +Z'-axis direction, is connected to an excitation electrode 502a, and an extraction electrode 503b, which extends to the other end of the bottom surface of the quartz-crystal piece 501 in +X-side and −Z'-axis direction, is connected to the excitation electrode 502b. The quartz-crystal piece 50 is mounted and bonded onto the base recess 521 of the package base 52 using electrically conductive adhesive 53, which will be explained hereafter.

The quartz-crystal vibrating device 500 comprises the package lid 51 made of the glass or piezoelectric material, having a lid recess 511 and a first connecting surface M1 formed surrounding the lid recess 511. The quartz-crystal vibrating device 500 also comprises the package base 52 made of the glass or piezoelectric material, having a base recess 521 and a second connecting surface M2 formed surrounding the base recess 521. Further, a cavity CT is formed between the base recess 521 of the package base 52 and the lid recess 511 of the package lid 51 for storing the piezoelectric vibrating piece 50. The cavity CT is filled with nitrogen gas or in a vacuum, and sealed in airtight manner.

Here, the length A of the package lid 51 and the package base 52 in X-axis direction is approximately 2,000 μm, and the width in the Z'-axis direction (not shown) is approximately 1,600 μm. Although the package lid 51 and package base 52 having outer dimension of 2,000 μm×1,600 μm is used in this specification, a miniaturized package lid 51 or package base 52 having outer dimensions of 1,600 μm×1,200 μm or 1,200 μm×1,000 μm can be used. Further, as the piezoelectric vibrating device miniaturizes, the width B of the first edge surface M1 of the package lid 51 and the edge surface M2 of the package base 52 becomes narrower, and narrows to 0.1×A or narrower, which calculates to 200 μm or narrower.

Also, on the base recess 521, a through-hole 522a is formed, which completely cuts through the package base 52, on one side of the bottom surface M9 in −X-axis side and in +Z'-axis direction. Similarly, on the base recess 521, a through-hole 522b is formed, which completely cuts through the package base 52, on the other side of the bottom surface M9 in +X-axis side and in −Z'-axis direction. As shown in FIG. 13, the through-holes 522a and 522b are conical-shaped, spread in −Y'-axis side. The shapes were made to fill the through-holes 522a and 522b with a filler 524 after bonding the package lid 51 and package base 52. The filler 524 is made of gold tin (Au—Sn) alloy, gold germanium (Au—Ge), gold silicon (Au—Si) alloy or curing gold paste or silver paste. Further, although through-holes 522a and 522b are conical-shaped in the fifth quartz-crystal vibrating device 500, it can be shaped in other types of polygon, such as rectangle.

On each through holes 522a and 522b, respective through-hole electrodes 523a and 523b are formed, having a connection pad 523M which extends to the bottom surface M9 of the base recess 521. Also, on both sides of the mounting surface (mounting surface of the quartz-crystal vibrating device) in X-axis direction of the package base 52, a pair of external electrodes 525a and 525b is formed, which electrically connects to respective through-hole electrodes 523a and 523b.

The quartz-crystal vibrating piece 50, which is shown in FIG. 13, is mounted onto the bottom surface M9 of the package base 52 using the electrically conductive adhesive 53, so as to connect the extraction electrode 503a and the through-hole electrode 523a (through the connection pad 523M), and to connect the extraction electrode 503b and the through-hole electrode 523b (through the connection pad 523M).

Thus, the respective excitation electrodes 502a and 502b on the quartz-crystal vibrating piece 50 are electrically connected to the respective external electrodes 525a and 525b by connecting through the extraction electrode 503a and 503b, electrically conductive adhesive 53 and through-holes 523a and 523b. Whenever an alternating voltage (a potential that regularly alternates positives and negatives) is applied to the pair of external electrodes 525a and 525b on the fifth quartz-crystal vibrating device 500, the external electrode 525a, the extraction electrode 503a and the excitation electrode 502b forms the same polarity. Similarly, the external electrode 525b, the through-hole electrode 523b, the extraction electrode 503b and the excitation electrode 502b forms the same polarity.

The package lid 51 and the package base 52 are bonded using the low-melting-point glass LG as a sealing material. The low-melting-point glass LG is a lead-free vanadium-based glass having an adhesive component that melts at 350° C. to 410° C.

Also, for example, if the package lid 51 and the package base 52 are compressed against each other, the low-melting-point glass LG having constant viscosity is raised toward the side surface M7 of the lid recess 511 and the side surface M8 of the base recess 521, thus forming the side low-melting-point glass regions 506. The thickness C of the low-melting-point glass region 506 is 5 μm or thicker. Therefore, distances D between the side surface M7 of the lid recess 511 or the side surface M8 of the base recess 521 to the quartz-crystal vibrating piece 50 are preferred to be 10 μm or larger, to avoid the low-melting-point glass regions 506 from attaching the quartz-crystal vibrating piece 50.

According to this configuration, even if the first edge surface M1 of the package lid 51 and the second connecting surface M2 of the package base 52 is quite narrow, the presence of the raised low-melting-point glass regions 506 allows the package lid 51 and the package base 52 to be bonded securely together with a larger connecting area. Therefore, the connecting area increases in proportion to the region of the raised low-melting-point glass, thus makes the leakage of atmosphere from outside of the third quartz-crystal vibrating device 500 into the cavity CT or the reverse less likely to occur, which makes the third quartz-crystal vibrating device 500 shock-resistant.

In the fifth embodiment, although the package lid 51 and package base 52 are recessed, the package lid 51 can be planar plate without recess.

<Manufacturing Method of the Fifth Quartz-Crystal Vibrating Device 500>

Figure 14:
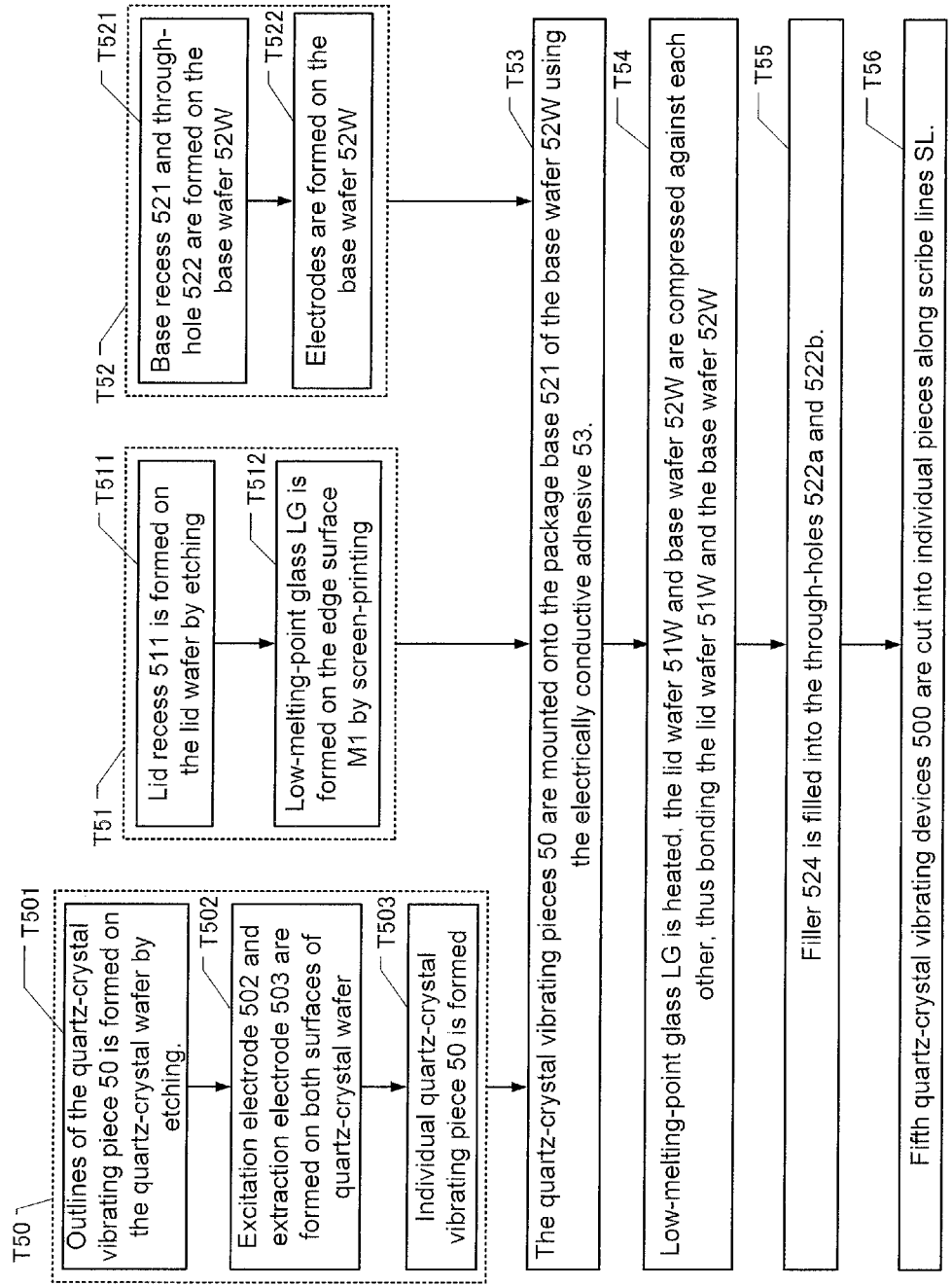
FIG. 14 is a flow-chart showing the manufacturing steps of the fifth quartz-crystal vibrating device 500 in the fifth embodiment.
Figure 15:
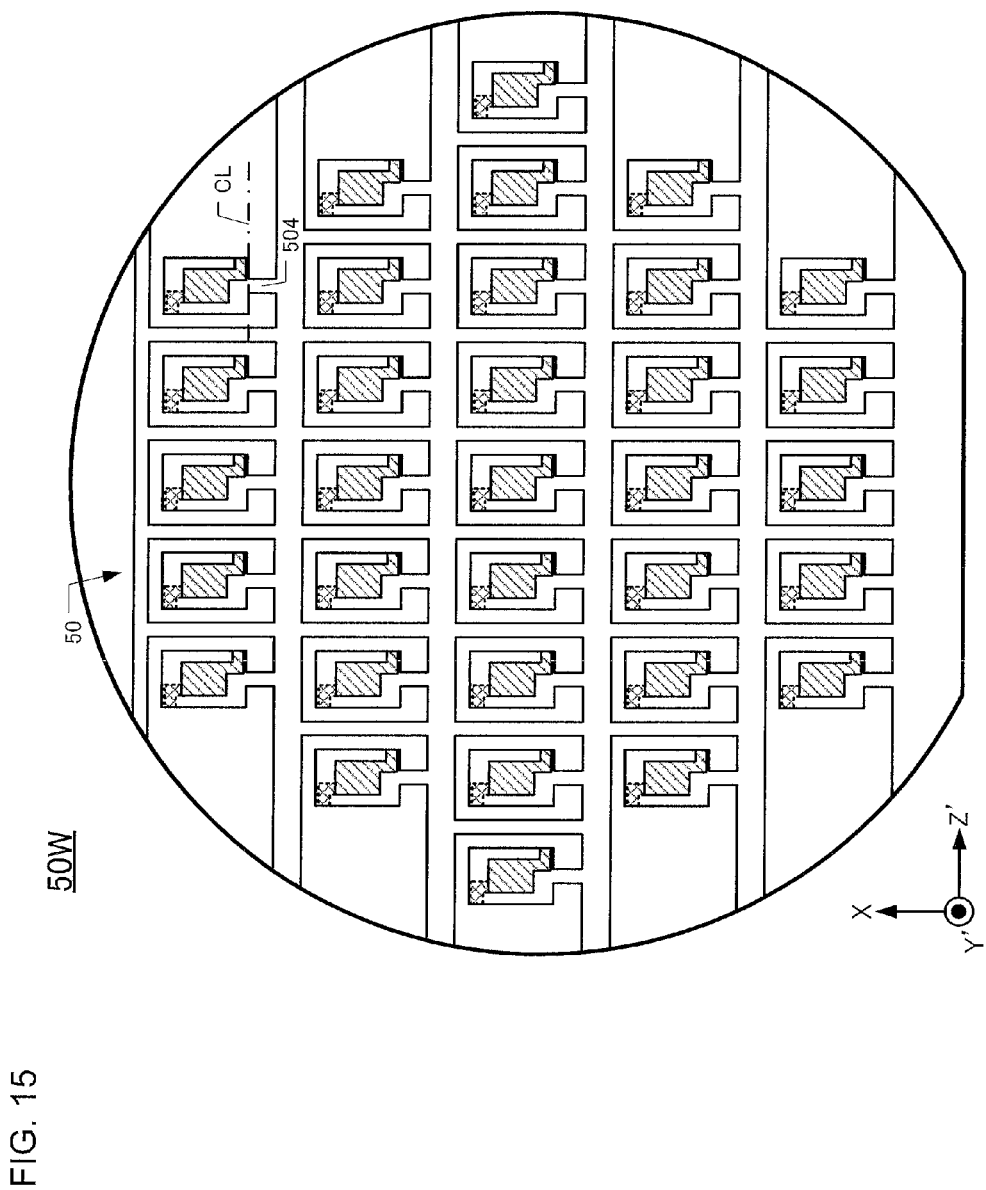
FIG. 15 is a plan view of the quartz-crystal wafer 50W.
Figure 16:
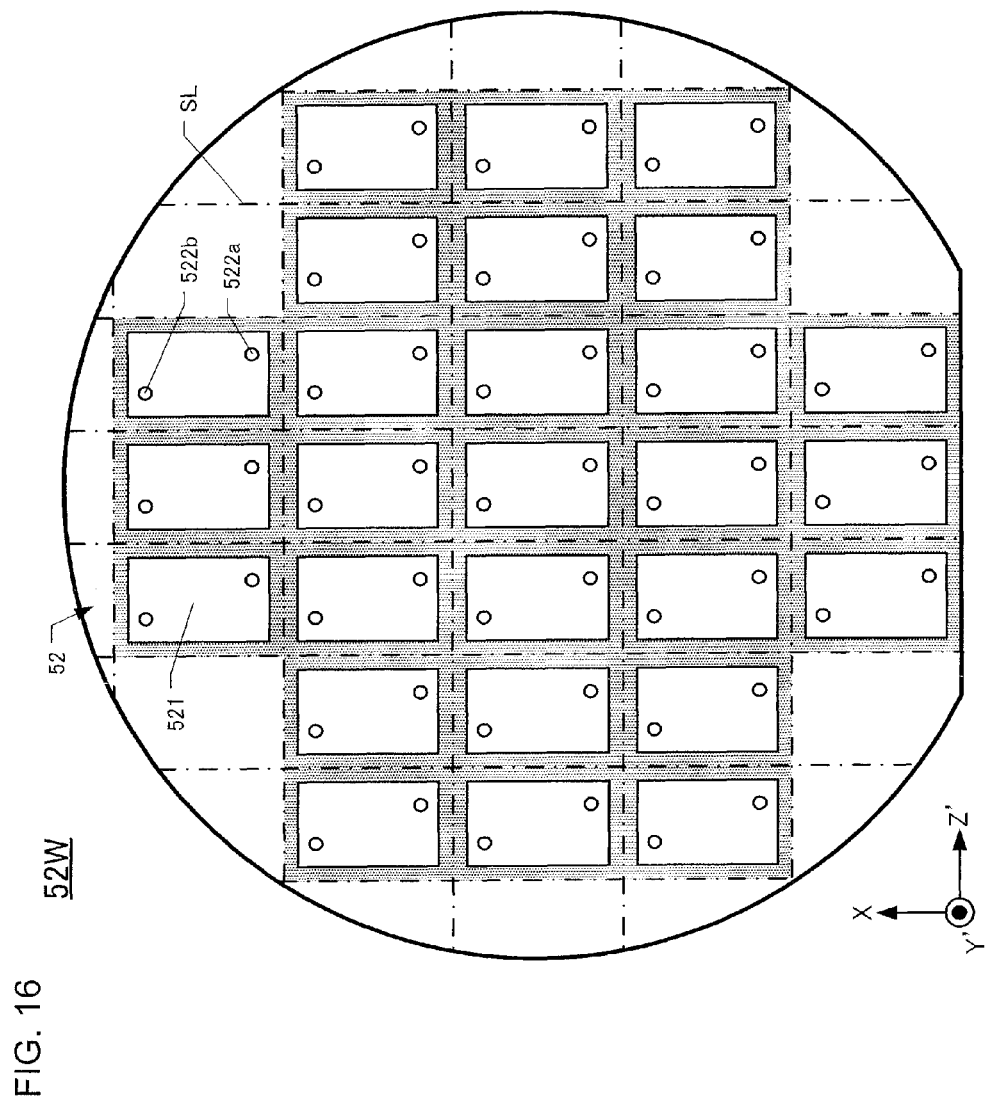
FIG. 16 is a plan view of the base wafer 52W.

FIG. 14 is a flow-chart showing the manufacturing method of the fifth quartz-crystal vibrating device 500. In FIG. 14, protocol T50 of manufacturing the quartz-crystal vibrating piece 50, protocol 51 of manufacturing the package lid 51 and protocol T52 of manufacturing the package base T52 can be carried out separately or in parallel. FIG. 15 is a plan view of the quartz-crystal wafer 50W in the fifth embodiment and FIG. 16 is a plan view of the base wafer 52W in the fifth embodiment.

In protocol T50, a quartz-crystal vibrating piece 50 is manufactured. Protocol T50 includes stepsT501 to T503.

In step T501, as shown in FIG. 15, multiple outlines of quartz-crystal vibrating piece 50 are formed on a quartz-crystal wafer 50W by etching, which is a circular, uniformly planar plate of quartz-crystal material. Here, each quartz-crystal vibrating piece 50 is joined to the quartz-crystal wafer 50W with the connecting portion 504.

In step T502, a foundation layer of chromium and overlaying gold layer is formed on both surfaces and side surfaces of the quartz-crystal wafer 50W by sputtering or vacuum-deposition. Here, the thickness of the chromium foundation layer is, for example, 500 Å, and overlaying gold layer is, for example, 2,500 Å. Then, a photoresist is applied uniformly on entire surface of the metal layer. Using an exposure tool (not shown), outline patterns of excitation electrodes 502a and 502b and extraction electrodes 503a and 503b, drawn on a photomask are imprinted in the quartz-crystal wafer 50W. Next, the exposed metal layers from the photoresist are etched. Thus, as shown in FIG. 15, the excitation electrodes 502a and 502b and extraction electrodes 503a and 503b are formed on both surfaces and side surfaces of the quartz-crystal wafer 50W (refer to FIG. 12).

In step T503, the quartz-crystal vibrating piece 50 is cut into individual pieces. Cutting is performed along cut lines CL, denoted by dot-dash lines in FIG. 15 using a dicing unit such as a laser beam or a dicing saw.

In protocol T51, the package lid 51 is manufactured. Protocol T51 includes steps T511 and T512.

In step T511, several hundreds to several thousands of lid recess 511 are formed simultaneously on a lid wafer (refer to FIG. 4), which is a circular, uniformly planar plate of quartz-crystal material. The lid recesses 511 are formed on the lid wafer by etching or mechanical processing, and the first connecting surfaces M1 are formed extending around the periphery of the lid recess 511.

In step T512, the low-melting-point glass LG is imprinted on the first connecting surface M1 of the lid wafer by screen-printing. The screen is, for example, a fabric made of nylon, Tetoron™, or stainless steel. After preliminary curing of the low-melting-point glass LG, the low-melting-point glass LG is formed on the first connecting surface M1 of the lid wafer.

In protocol T52, the package base 52 is manufactured. Protocol T52 includes steps T521 and T522.

In step T521, as shown in FIG. 16, several hundreds to several thousands of base recesses 521 are formed on a base wafer 52W, which is a circular, uniformly planar plate of quartz-crystal material. The base recesses 521 are formed on the base wafer 52W by etching or mechanical processing, and the second connecting surfaces M2 are formed extending around the periphery of the base recess 521. At the same time, on each sides of the package base 52 in X-axis directions, circular base through-holes 522a and 522b are formed that completely cuts through the base wafer 52W.

In step T522, on the mounting surface of the package base 52 (mounting surface of the quartz-crystal vibrating device), respective pair of external electrodes 525a and 525b are formed. At the same time, the respective through-hole electrodes 523a and 523b are formed on each through-hole 522a and 522b.

In step T53, the quartz-crystal vibrating pieces 50 manufactured in protocol T50 are mounted onto the bottom surface M9 of the package base 521 using the electrically conductive adhesive 53. Here, the quartz-crystal vibrating pieces 50 are mounted onto the bottom surface M9 (refer to FIG. 13) of the package base 52 so as to align the positions of the extraction electrodes 503a and 503b of the quartz-crystal vibrating piece 50 and the connection pad 523M on the bottom surface M9.

In step T54, the low-melting-point glass LG is heated, the lid wafer 51W and base wafer 52W are compressed against each other, thus bonding the lid wafer 51W and the base wafer 52W using the low-melting-point glass LG. Here, whenever the package lid 51 and the package base 52 are pressed against each other, the low-melting-point glass LG having constant viscosity raises to the side surface M7 of the lid recess 511 and to the side surface M8 of the base recess 521, thus forming the side surface low-melting-point glass regions 506 (refer to FIG. 13).

In step T55, a filler 524 (refer to FIG. 13) made of gold tin (Au—Sn) alloy, gold germanium (Au—Ge) or gold silicon (Au—Si) alloy or curing gold or silver paste is filled into the through-holes 522a and 522b. Then, the filler seals the through-holes in a vacuum or in a reflow chamber filled with inactive gas. Thus, a plurality of fifth quartz-crystal vibrating device 500 is manufactured having cavity CT in a vacuum or filled with inactive gas.

In step T56, the lid wafer and base wafer 52W bonded together is cut into individual quartz-crystal vibrating devices 500. Cutting is performed along scribe lines SL, denoted by dot-dash lines in FIG. 16 using a dicing unit such as a laser beam or a dicing saw. Thus, several hundreds to several thousands of fifth quartz-crystal vibrating devices 500 are produced.

Multiple representative embodiments are described in detail above. As will be evident to those skilled in the relevant art, the present invention may be changed or modified in various ways within the technical scope of the invention.

For example, instead of forming castellations on both sides in X-axis directions, it can be formed on four corners on the quartz-crystal frame or package base.

Also, in this embodiment, although the base wafers, quartz-crystal wafers and lid wafers are brought together using the low-melting-point glass, it can be bonded using a polyimide resin. If the polyimide resin is used for bonding, wafers can be bonded by screen-printing or exposing after applying photoresist polyimide resin on entire surface.

Also, although the external electrodes in this embodiment are formed on two opposing sides of the bottom surfaces in X-axis directions, it can be replaced with the external electrodes formed on each four corners. Here, the extra external electrodes are used for grounding.

Further, in this specification, although the various embodiments have been described in the context of AT-cut piezoelectric vibrating pieces, it will be understood that the embodiments can be applied with equal facility to tuning-fork type piezoelectric vibrating pieces having a pair of vibrating arms.

In this specification, although the various embodiments have been described in the context of using the quartz-crystal vibrating pieces, it will be understood that the embodiments can be applied with equal facility to piezoelectric materials such as lithium tantalite and lithium niobate. Furthermore, the present disclosure can be applied to piezoelectric oscillators that also include an IC configured as an oscillating circuit mounted inside the package on the package base.

What is claimed is:
1. A piezoelectric device, comprising:
  a piezoelectric frame, including a piezoelectric vibrating piece, a frame body surrounding the piezoelectric vibrating piece and separated therefrom by at least one through hole, and a supporting portion for supporting the piezoelectric vibrating piece to the frame body, each piezoelectric frame having a first surface and a second surface;
  a package lid having a first connecting surface, in which at least a part of the first connecting surface opposes to the first surface of the frame body;
  a package base, including a mounting surface for forming a pair of external electrodes and a top surface formed opposite the mounting surface, said top surface including at least a part of a second connecting surface opposed to the second surface;

a first sealing material formed between the first connecting surface and the first surface of the frame body; and a second sealing material formed between the second connecting surface and the second surface of the frame body;

wherein at least one of the first sealing material or the second sealing material extends onto the side surface of the opening through-hole of the frame body.

2. The piezoelectric device of claim 1, wherein the first sealing material and the second sealing material are connected at the side surface.

3. The piezoelectric device of claim 1, wherein the package lid, the piezoelectric frame and the package base have a rectangular shape with four sides as viewed from the mounting surface; and wherein a relationship is described as $B \leq A \times 0.1$;

wherein a length of the one side is A and a width of the frame body is B.

4. The piezoelectric device of claim 2, wherein the package lid, the piezoelectric frame and the package base have a rectangular shape with four sides as viewed from the mounting surface; and wherein a relationship is described as $B \leq A \times 0.1$;

wherein a length of the one side is A and a width of the frame body is B.

5. The piezoelectric device of claim 3, wherein the first sealing material is formed on the first connecting surface with a width of 5 μm or wider width than the width B of the frame body;

the second sealing material is formed on the second connecting surface with a width of 5 μm or wider width than the width B of the frame body; and the width of the opening through-hole is 10 μm or wider.

6. The piezoelectric device of claim 1, wherein the first surface or the second surface includes a step portion, so as to reduce a thickness of the side surfaces of the opening through-holes.

7. The piezoelectric device of claim 2, wherein the first surface or the second surface includes a step portion, so as to reduce a thickness of the side surfaces of the opening through-holes.

8. The piezoelectric device of claim 3, wherein the first surface or the second surface includes a step portion, so as to reduce a thickness of the side surfaces of the opening through-holes.

9. The piezoelectric device of claim 4, wherein the first surface or the second surface includes a step portion, so as to reduce a thickness of the side surfaces of the opening through-holes.

10. The piezoelectric device of claim 1, wherein, as viewed from the mounting surface, a plurality of grooves is continuously formed on the opening through-hole of the piezoelectric body.

11. The piezoelectric device of claim 2, wherein, as viewed from the mounting surface, a plurality of grooves is continuously formed on the opening through-hole of the piezoelectric body.

12. The piezoelectric device of claim 3, wherein, as viewed from the mounting surface, a plurality of grooves is continuously formed on the opening through-hole of the piezoelectric body.

13. The piezoelectric device of claim 4, wherein, as viewed from the mounting surface, a plurality of grooves is continuously formed on the opening through-hole of the piezoelectric body.

14. The piezoelectric device of claim 5, wherein, as viewed from the mounting surface, a plurality of grooves is continuously formed on the opening through-hole of the piezoelectric body.

15. A piezoelectric device, comprising;

a piezoelectric vibrating piece that vibrates when electrical voltage is applied;

a package base having a base recess for mounting the piezoelectric vibrating piece;

a package lid configured to span said base recess and mate with the package base to form an enclosure for storing the piezoelectric vibrating piece; and a sealing material formed in a peripheral manner, sealing and bonding the package base and the package lid to form an airtight seal between said lid and said base;

wherein the sealing material extends onto a side surface of the base recess and said enclosure surrounds said piezoelectric vibrating piece in an airtight manner, the package lid comprises a lid recess formed in the same shape as the base recess defined by the package base; and the sealing material extends onto a side surface of the lid recess.

16. The piezoelectric device of claim 15, wherein the package lid comprises a first connecting surface surrounding the lid recess;

the package base comprises a second connecting surface surrounding the base recess for bonding to the first connecting surface;

wherein the package lid and the package base have a rectangular shape with four sides; and wherein a relationship is described as $B \leq A \times 0.1$; and wherein a length of the one side is A and a width of the frame body is B.

17. The piezoelectric device of claim 16, wherein the sealing material is formed on the first connecting surface and the second connecting surface with a width of 5 μm or wider width than the width B of the frame body; and a distance between a side surface of the package base or the package lid to the piezoelectric device is 10 μm or larger.

* * * * *